United States Patent
Mandelman et al.

(10) Patent No.: US 6,271,080 B1
(45) Date of Patent: Aug. 7, 2001

(54) STRUCTURE AND METHOD FOR PLANAR MOSFET DRAM CELL FREE OF WORDLINE GATE CONDUCTOR TO STORAGE TRENCH OVERLAY SENSITIVITY

(75) Inventors: Jack A. Mandelman, Stormville, NY (US); Toshiharu Furukawa; William R. Tonti, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/465,109

(22) Filed: Dec. 16, 1999

(51) Int. Cl.$^7$ ............................................. H01L 21/8242
(52) U.S. Cl. ........................... 438/243; 438/248; 438/386
(58) Field of Search ................................. 257/301, 302; 438/243, 244, 248, 386, 391

(56) References Cited

U.S. PATENT DOCUMENTS

| | | | |
|---|---|---|---|
| 4,269,636 | 5/1981 | Rivoli et al. | 438/359 |
| 4,728,606 | 3/1988 | Bukhman et al. | 438/361 |
| 4,763,180 | 8/1988 | Hwang et al. | 257/302 |
| 4,833,516 | 5/1989 | Hwang et al. | 257/302 |
| 5,378,911 | 1/1995 | Murukami | 257/334 |
| 5,389,559 | 2/1995 | Hsieh et al. | 438/243 |
| 5,493,134 | 2/1996 | Mehrotra et al. | 257/132 |
| 5,702,987 | 12/1997 | Chen et al. | 438/187 |
| 5,736,760 | 4/1998 | Hieda et al. | 257/301 |
| 5,763,309 | 6/1998 | Chang | 438/262 |
| 5,770,878 | 6/1998 | Beasom | 257/330 |
| 5,801,417 | 9/1998 | Tsang et al. | 257/333 |
| 5,825,704 | 10/1998 | Shau | 365/222 |
| 5,831,301 | 11/1998 | Horak et al. | 257/302 |
| 5,981,332 | * 11/1999 | Mandenman et al. | 438/246 |
| 6,037,210 | * 3/2000 | Leas | 438/245 |
| 6,066,526 | * 5/2000 | Hakey et al. | 438/243 |
| 6,150,210 | * 11/2000 | Arnold | 438/243 |
| 6,204,112 | * 3/2001 | Chakravarti et al. | 438/243 |
| 6,204,140 | * 3/2001 | Gruening et al. | 438/386 |
| 6,207,494 | * 3/2001 | Graimann et al. | 438/248 |

FOREIGN PATENT DOCUMENTS

| | | |
|---|---|---|
| 0791959-A1 | * 8/1997 | (EP) . |
| 02000200887-A | * 7/2000 | (JP) . |
| 02000252436-A | * 11/2000 | (JP) . |

* cited by examiner

Primary Examiner—Olik Chaudhuri
Assistant Examiner—Hoai Pham
(74) Attorney, Agent, or Firm—Scully, Scott, Murphy & Presser; Steven Capella, Esq.

(57) ABSTRACT

A memory cell ($8F^2$ and sub-$8F^2$) formed by: (a) forming a stack of at least four material layers on a surface of a semiconductor substrate, wherein at least two of said material layers of said stack are selectively etchable relative to each other; (b) patternwise etching through said stack to define a critical pattern of remaining stack and spaces where said semiconductor substrate is exposed, said critical pattern defining possible locations for trench capacitors and gate conductors; (c) filling said spaces with a filler material which is selectively etchable relative to a topmost layer of said remaining stack; (d) planarizing the filler material stopping at said topmost layer of said remaining stack; (e) forming trench capacitors in said semiconductor substrate by etching through portions of said filler material and said substrate, wherein said etching removes a portion of said topmost layer of said remaining stack and exposes a portion of a layer of said stack that is next to the topmost layer; (f) planarizing the remaining portion of said stack and filler material to remove the remaining portion of the topmost layer of said stack and the remaining portion of the layer that is next to the topmost layer and thereby exposing a layer of said stack that is second from the topmost layer; (g) replacing at least a portion of either said remaining stack and/or remaining filler material with a placeholder material corresponding to locations for gate conductors; and (h) forming said gate conductors and remaining portions of said transistors, bitlines and wordlines of said memory cell.

14 Claims, 34 Drawing Sheets

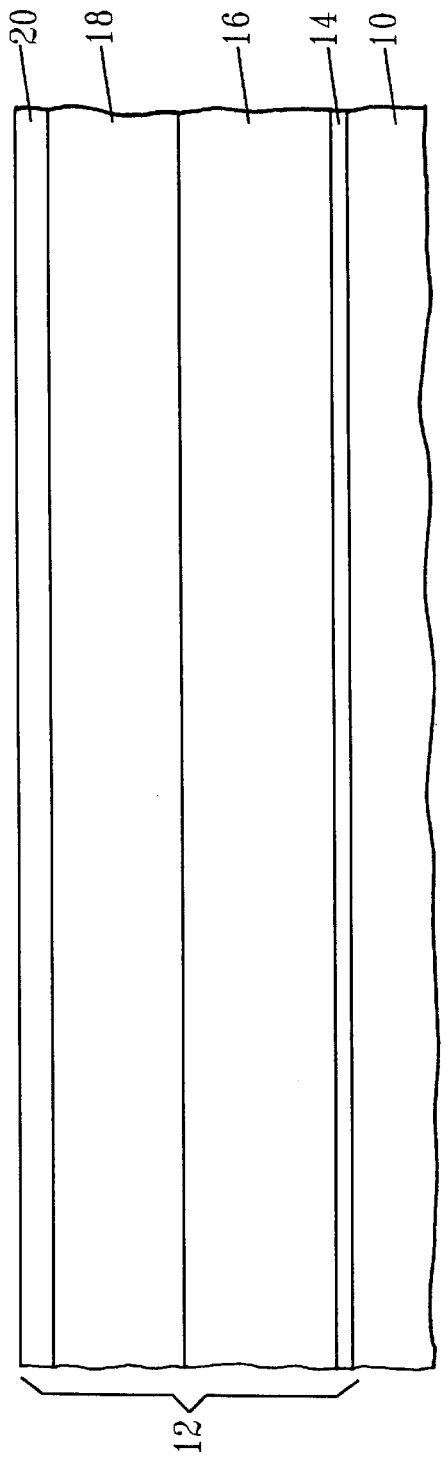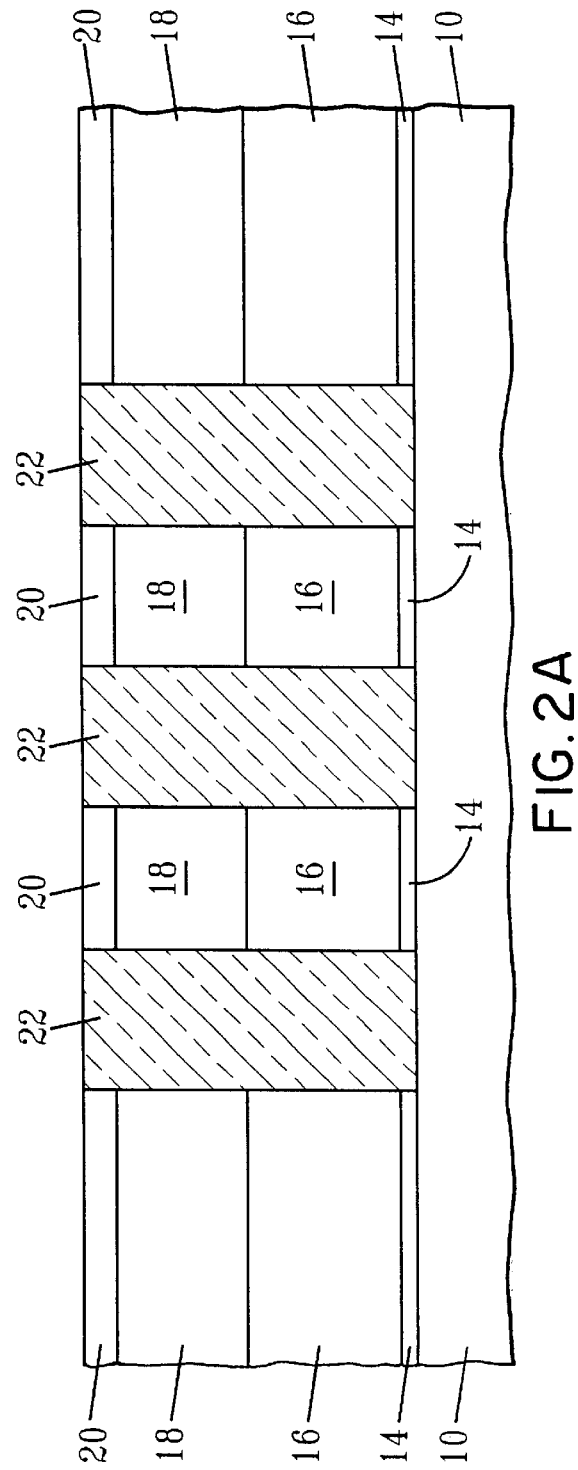

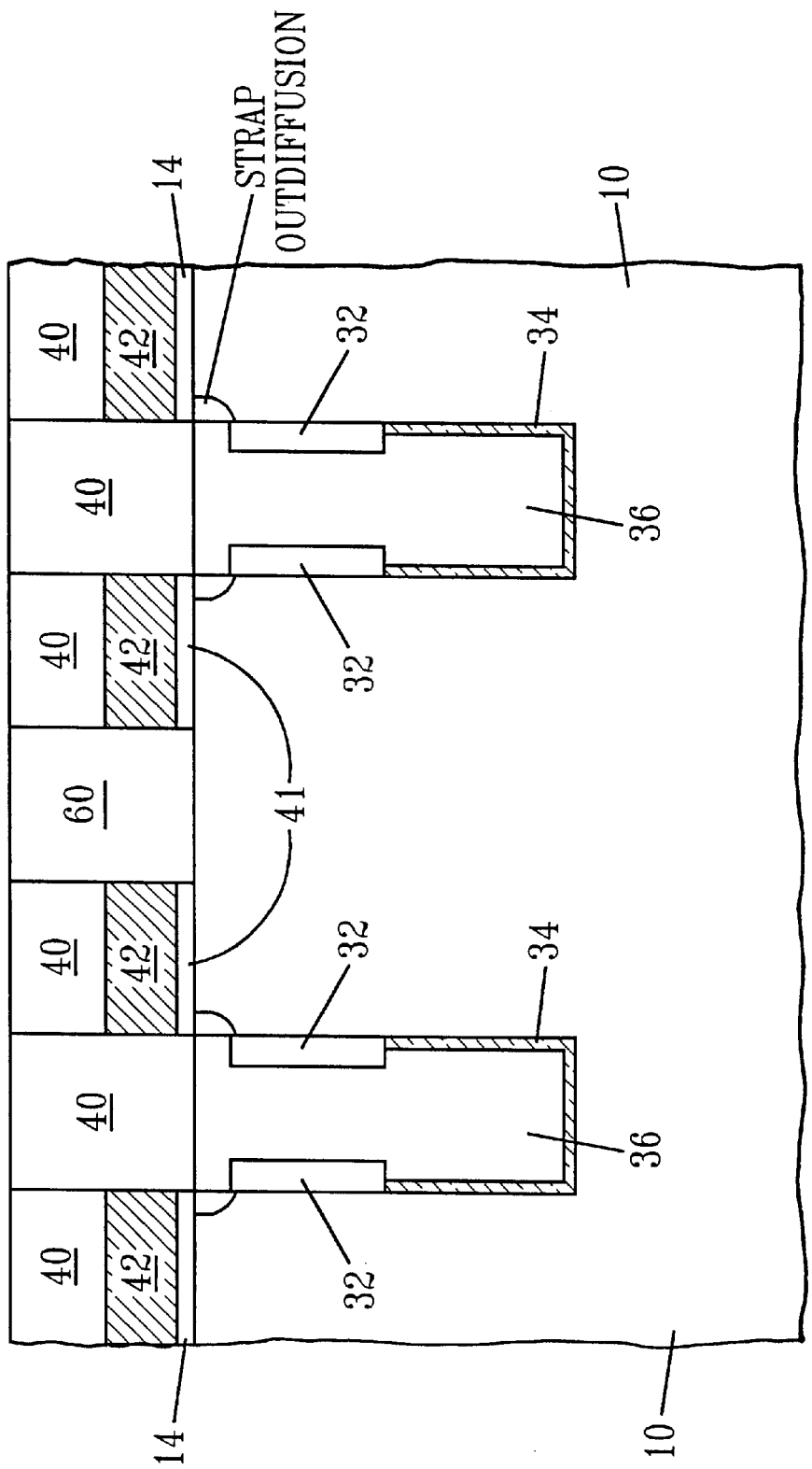

STRUCTURE AND METHOD FOR PLANAR MOSFET DRAM CELL FREE OF WORDLINE GATE CONDUCTOR TO STORAGE TRENCH OVERLAY SENSITIVITY

DESCRIPTION

1. Field of the Invention

The present invention relates to semiconductor memory cells, and more particular to a planar metal oxide semiconductor field effect transistor (MOSFET) dynamic random access memory (DRAM) cell in which the wordline gate conductor to storage trench overlay sensitivity problem typically present in prior art memory cells has been eliminated.

2. Background of the Invention

As the minimum feature size and cell architecture, i.e., number of squares, are scaled down, robust design points for dynamic random access memory (DRAM) cells utilizing metal oxide semiconductor field effect transistors (MOSFETS) and deep trench storage capacitors (also referred to herein as trench capacitors) are increasingly difficult to achieve. Scalability of the planar MOSFET in this environment is severely limited by the overlay tolerance between the wordline gate conductor, i.e., gate conductor, and the trench storage capacitor. This overlay sensitivity is exacerbated by the extent of the buried-strap outdiffusion.

One manifestation of the scalability difficulties of planar DRAM MOSFETs is degradation of the retention time tail, due to increased junction leakage resulting from very high channel doping concentrations required to suppress short-channel effects. These short channel effects (often referred to as drain induced barrier lowering (DIBL)) are greatly amplified by the encroachment of the deep-strap outdiffusion upon the array MOSFET. Because of the overlay variation between the wordline gate conductor and the deep storage trench, the distance between the edge of the buried-strap outdiffusion and the edge of the wordline gate conductor may typically vary by as much as ±30–50% of the design distance.

To guard against excessive off-current when the buried strap is close to the array MOSFET, the channel doping concentration of the array MOSFET must be elevated to levels which result in increased junction leakage. Increased junction leakage is a defect mechanism activated by the increased electrical fields associated with high channel doping. It is thus essential that the overlay variation between the wordline gate conductor and the deep storage trench be very tightly controlled.

For $6F^2$ and $7F^2$ planar MOSFET cells, the above-mentioned effect of wordline gate conductor and deep trench overlay tolerance is amplified relative to the $8F^2$ layout; the channel length is determined by the distance between the buried-strap outdiffusion and bitline diffusion, instead of the gate conductor.

In view of the above mentioned drawback with prior art memory cell structures, there is a need for fabricating a memory cell structure ($8F^2$ and sub-$8F^2$) that is free of wordline gate conductor to storage trench overlay sensitivity.

SUMMARY OF THE INVENTION

One object of the present invention is to provide a method of fabricating a semiconductor memory cell in which the wordline gate conductor to storage trench overlay sensitivity problem has been substantially eliminated.

Another object of the present invention is to provide a method in which precise spacing of the storage trench and adjacent wordline gate conductor of the memory cell is achieved using a single mask.

A still further object of the present invention is to provide a method which is capable of fabricating $8F^2$ and sub-$8F^2$ memory cells.

A yet further object of the present invention is to provide a method wherein the overlay sensitivity problem is substantially eliminated and the concentration of the dopant used in forming the channel of the structure need not be increased.

These and other objects and advantages can be achieved in the present invention by utilizing the inventive method which is capable of producing a planar MOSFET trench DRAM cell that is immune to wordline gate conductor to trench capacitor overlay tolerance.

In accordance with one aspect of the present invention, a method of fabricating a planar MOSFET trench DRAM cell that has a distance between wordline gate conductor and storage trench which is entirely independent of overlay is provided. Specifically, the present invention provides a method of forming a memory cell in a semiconductor substrate, said memory cell comprising trench capacitors, transfer transistors, bitlines and wordlines, said method comprising:

(a) forming a stack of at least four material layers on a surface of a semiconductor substrate, wherein at least two of said material layers of said stack are selectively etchable relative to each other;

(b) patternwise etching through said stack to define a critical pattern of remaining stack and spaces where said semiconductor substrate is exposed, said critical pattern defining possible locations for trench capacitors and gate conductors;

(c) filling said spaces with a filler material which is selectively etchable relative to a topmost layer of said remaining stack;

(d) planarizing the filler material stopping at said topmost layer of said remaining stack;

(e) forming trench capacitors in said semiconductor substrate by etching through portions of said filler material and said substrate, wherein said etching removes a portion of said topmost layer of said remaining stack and exposes a portion of a layer of said stack that is next to the topmost layer;

(f) planarizing the remaining portion of said stack and filler material to remove the remaining portion of the topmost layer of said stack and the remaining portion of the layer that is next to the topmost layer and thereby exposing a layer of said stack that is second from the topmost layer;

(g) replacing at least a portion of either said remaining stack and/or remaining filler material with a placeholder material corresponding to locations for gate conductors; and (h) forming said gate conductors and remaining portions of said transistors, bitlines and wordlines of said memory cell.

In one embodiment of the present invention, the trench capacitor is formed in the same stripe or block as the wordline gate conductor. This is achieved in the present invention by replacing at least a portion of the filler material with a placeholder material, See step (g) above. The first embodiment of the present invention is typically employed in fabricating $8F^2$ memory cells.

In a second embodiment of the present invention, the wordline gate conductor is formed in the spaces that are between the stripes or blocks which contain the trench capacitor. This is achieved in the present invention by replacing at least a portion of the stack with a placeholder material, See step (g) above. The second embodiment of the present invention is typically employed in fabricating sub-$8F^2$ memory cells.

In another aspect of the present invention, memory cells are provided in which the wordline gate conductor of the cell is formed in the same stripe or block as the trench capacitor ($8F^2$ memory cells) or alternatively, the wordline gate conductor is formed in spaces that lay adjacent to the trench capacitors (sub-$8F^2$ memory cells).

BRIEF DESCRIPTION OF THE DRAWINGS

FIGS. 1–15 illustrate a first embodiment of the present invention wherein a $8F^2$ memory cell is formed.

FIGS. 19–29 illustrate a second embodiment of the present invention wherein a sub-$8F^2$ memory cell is formed.

DEATILED DESCRIPTION OF THE INVENTION

Figure 2B:
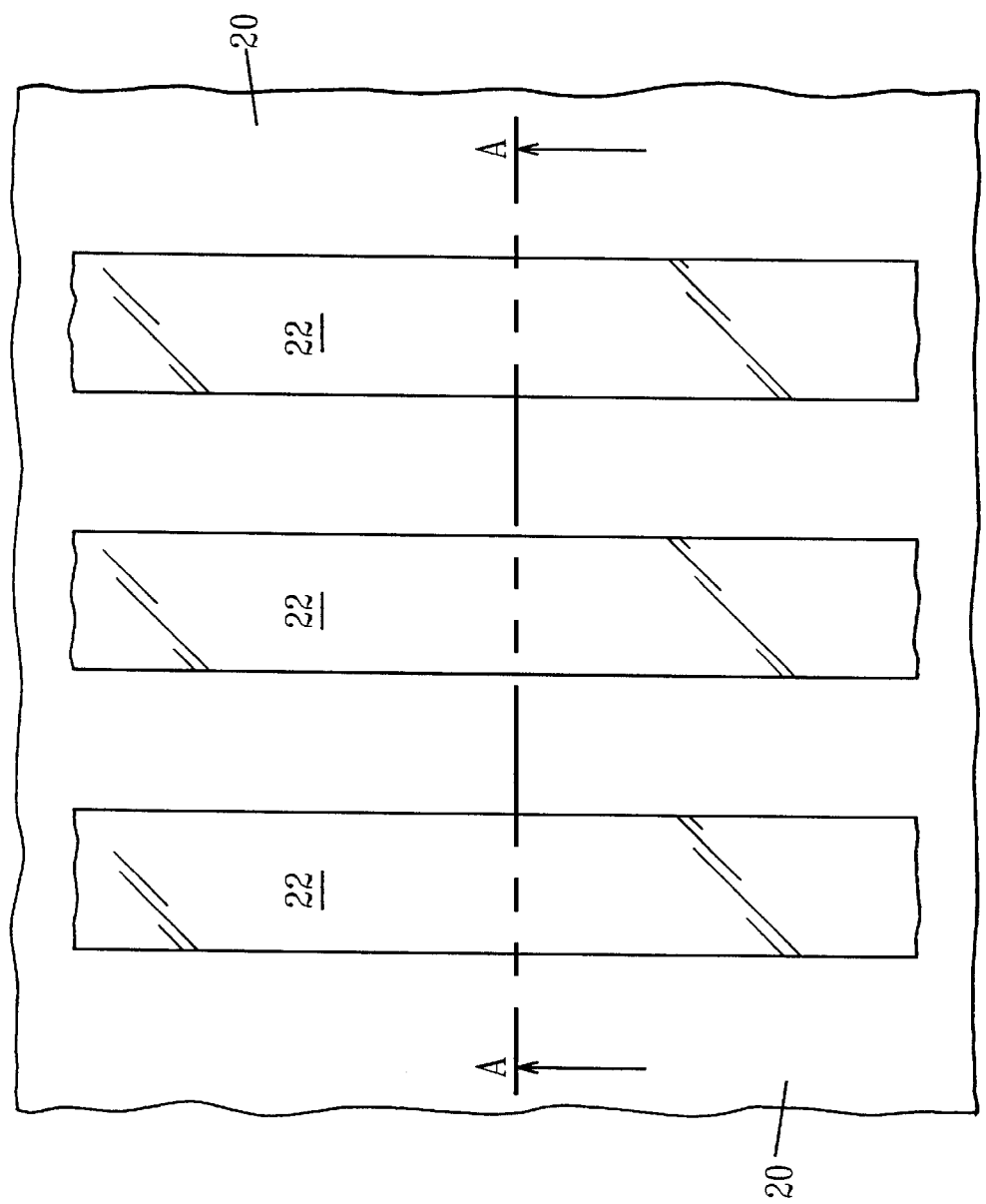

The present invention which provides a memory cell structure in which the wordline gate conductor to trench capacitor overlay sensitivity problem has been substantially eliminated and a method of manufacturing the same will now be described in greater detail by referring to the drawings that accompany the present application. It is noted that in the accompanying drawings like reference numerals are used for describing like and corresponding elements.

FIRST EMBODIMENT

Referring to FIG. 1, there is shown a typical structure that is formed from step (a) of the present invention. Specifically, the structure of FIG. 1 comprises a semiconductor substrate 10 and a stack 12. The stack typically contains four material layers in which at least two of the four material layers are selectively etchable relative to each other. Although FIG. 1 illustrates the presence of four material layers in the stack, a stack containing more than four material layers is also contemplated in the present invention.

Suitable semiconductor substrates that can be employed in the present invention include semiconductor chips or wafers which are composed of a conventional semiconducting material. Some illustrative examples of semiconducting materials that can be present in substrate 10 include, but are not limited to: Si, Ge, SiGe, GaAs, InAs, InP and all other III/V compounds. Layered substrates composed of the same or different semiconducting material, e.g., Si/SiGe and Si/SiO$_2$/Si, are also contemplated herein. Of these semiconducting materials, it is preferred that substrate 10 be composed of Si. The substrate may be of the p-type or n-type depending on the type of memory cell being manufactured.

Insofar as stack 12 is concerned, FIG. 1 illustrates the presence of the following four material layers: a pad oxide layer 14, a nitride pad layer 16 (second layer from the topmost layer), an oxide layer 18 (layer next to the topmost layer) and a topmost layer 20 of either silicon nitride or polysilicon. As is shown, pad oxide 14 is formed on substrate 10, nitride pad 16 is formed on pad oxide 14, oxide layer 18 is formed on nitride pad 16, and the topmost layer is formed on oxide layer 18.

The stack shown in FIG. 1 is composed of conventional materials and it is fabricated using conventional techniques well known to those skilled in the art. For example, pad oxide 14 of stack 12 is composed of any oxide material such as SiO$_2$ which is capable of being grown thermally (highly preferred) or formed by conventional deposition techniques (such as chemical vapor deposition, plasma-assisted chemical vapor deposition, sputtering and the like) well known to those skilled in the art. The thickness of the pad oxide layer, while not being critical to the present invention, is typically in the range of from about 3 to about 15 nm, with a range of from 5 to about 10 nm being highly preferred.

The next material layer of stack 12 is nitride pad layer 16. Nitride pad layer 16 is composed of any conventional relatively hard material, e.g., silicon nitride, which is capable of slowing the polishing process and it is formed on top of oxide pad layer 14 utilizing conventional deposition processes such as chemical vapor deposition, plasma-assisted chemical vapor deposition, sputtering, evaporation and other like deposition processes well known to those skilled in the art. The thickness of the nitride pad layer may vary depending upon the etching and planarization processes employed in the present invention. Typically, however, the thickness of nitride pad layer 16 is from about 50 to about 350 nm, with a range of from about 100 to about 300 nm being highly preferred.

The next material layer of stack 12 (which is next to the topmost layer of the stack) is oxide layer 18. This oxide layer, which may be composed of the same or different oxide material as pad oxide layer 14, is formed utilizing conventional deposition processes well known in the art, e.g., chemical vapor deposition, and the thickness of oxide layer 18 is typically in the range of from about 100 about 1500 nm, with a thickness range of from about 300 to about 1000 nm being highly preferred.

The topmost layer of stack 12 is composed of either silicon nitride or polysilicon. The topmost stack layer is formed using conventional deposition processes well known to those skilled in the art, including, but not limited to: chemical vapor deposition, plasma-assisted chemical vapor deposition, evaporation and sputtering. The thickness of the topmost layer of the stack is not critical to the present invention, however a typical thickness range for the same is from about 10 to about 150 nm, with a thickness range of from about 20 to about 100 nm being highly preferred.

After forming the stack on the surface of the semiconductor substrate, a photoresist, not shown in the drawings, is formed on the topmost layer of stack 20 and a line/space pattern is opened in the array portion of the structure. Specifically, the topmost layer of stack 12, i.e., layer 20, is etched open utilizing a conventional dry etching process such as reactive ion etching (RIE), and then the underlying layers of the stack, i.e., material layers 18, 16 and 14, are directionally etched to semiconductor substrate 10. The directional etching process employed in this step of the present invention is carried out utilizing any conventional dry etch process such as RIE or plasma etching.

As shown in FIG. 2A (cross-sectional view) and FIG. 2B (top view of FIG. 2A), the openings are filled with a suitable filler material 22 such as an oxide and then the structure is planarized to topmost layer 20. This results in the formation of filled stripe regions in the structure, see FIG. 2B. This step of the present invention is carried out utilizing a conventional deposition process such as chemical vapor deposition, while the planarization step is carried out utilizing a conventional planarization process such as chemical-mechanical polishing.

It should be noted that the mask level employed above is not limited to forming stripes in the array. Instead of stripes, a pattern of blocks may be defined. Each block may become either the location of the storage trench or an array MOSFET. Such a blocked cell pattern allows more general cell architectures to be realized with the process disclosed in this application.

Figure 3A:
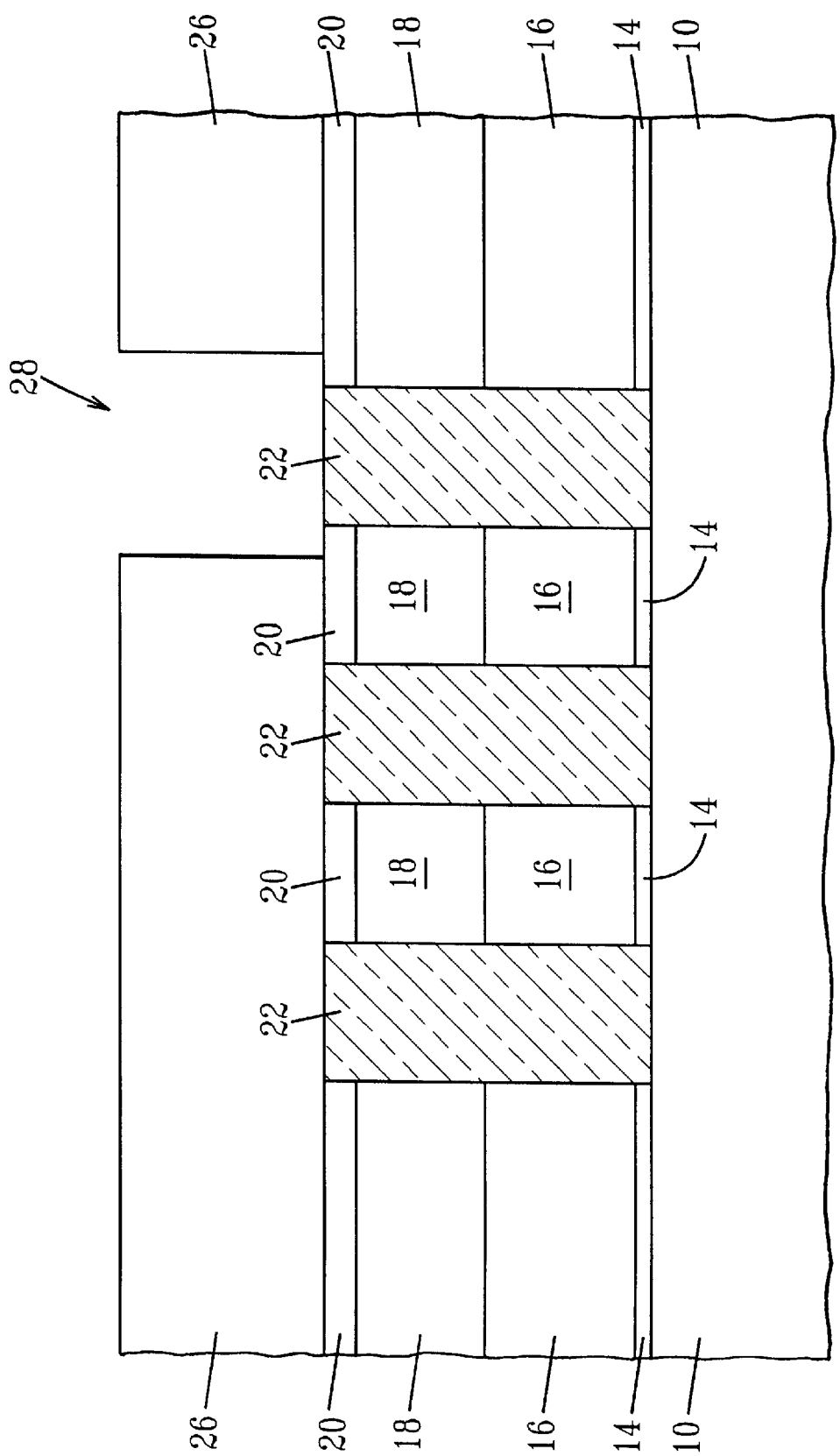

Next, as shown in FIGS. 3A (cross-sectional view) and 3B (top view of FIG. 3A), a photoresist 26 is formed on topmost stack layer 20 and pattern 28 is opened in the photoresist exposing one of the previously filled stripe regions using conventional lithography and RIE.

The exposed filled stripe region is then removed by RIE or another like dry etching process to the underlying semiconductor substrate. The photoresist is thereafter removed and a deep trench (the term "deep" meaning a depth of at least about 1 μm or more) is then etched into the substrate in the region wherein the filler material has been removed utilizing a conventional etching process such as RIE that is typically employed in the art in forming deep trench regions.

Figure 4:
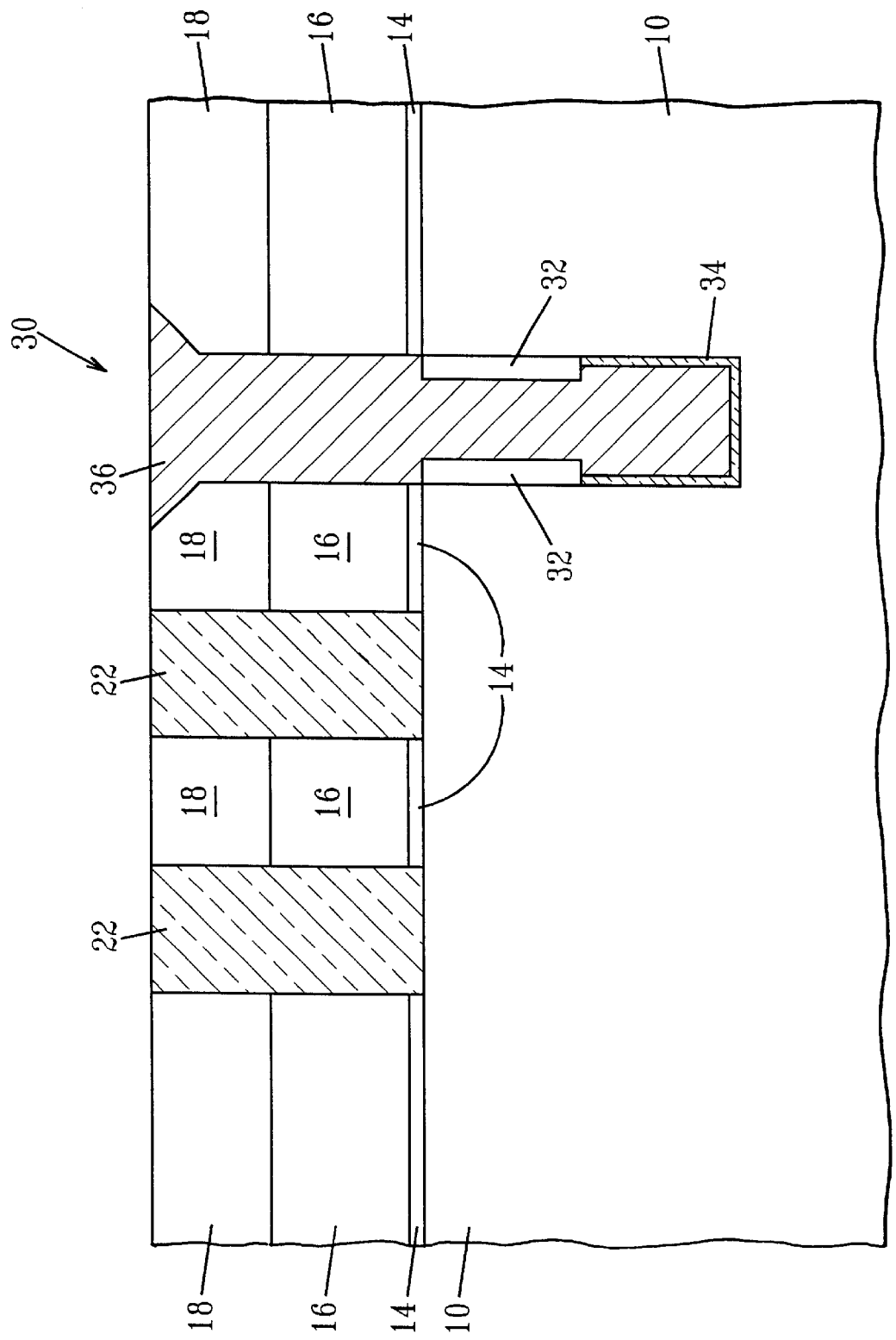

A storage trench capacitor 30, as shown in FIG. 4, is then formed in the deep trench utilizing conventional methods that are well known to those skilled in the art. For example, after etching the deep trench, a buried plate, not shown in the drawings, is formed about the exterior of the trench, collar region 32, which may be LOCOS or deposited, is formed in the deep trench, a node dielectric 34 is formed lining lower portions of the interior sidewalls of the deep trench, the deep trench is filled with doped polysilicon 36 and the deep trench structure is then subjected to another planarization step. It is noted that during the course of the deep trench etching and subsequent planarization, the topmost layer of stack 12 is removed. The above steps of deep trench etching and deep trench processing form the structure shown in FIG. 4.

Following the deep trench etch and processing, oxide layer 18 (including the polysilicon in the top part of the deep trench) is removed by chemical-mechanical polishing down to nitride pad layer 16. The stripe regions containing filler material 22 are then etched open to the underlying semiconductor substrate, selective to the nitride and polysilicon. A placeholder material 38 such as tungsten or another like conductor is then formed in the openings utilizing a conventional deposition process, e.g., chemical vapor deposition, and then the structure is planarized to the top surface of nitride pad layer 16.

Figure 5A:
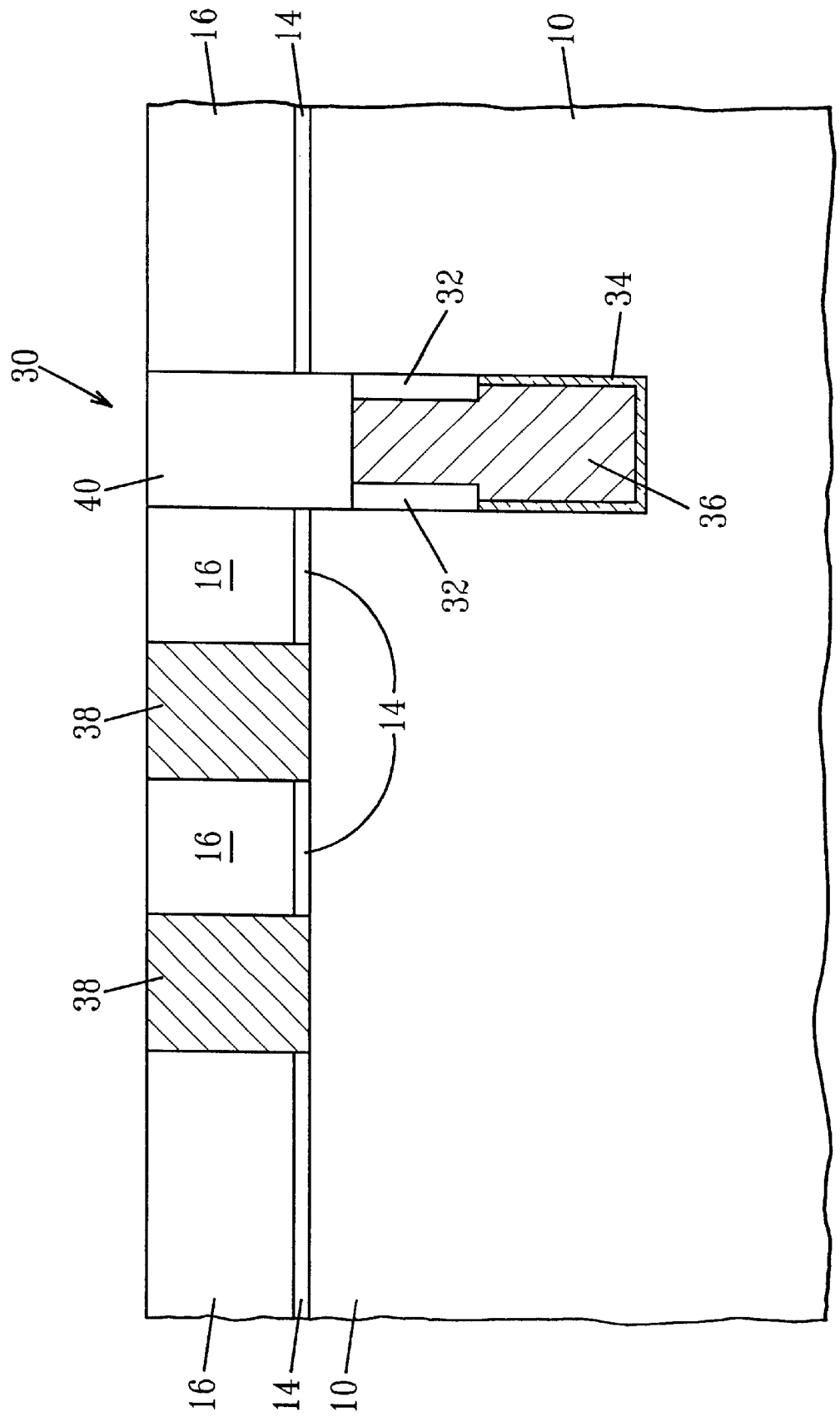
Figure 5B:
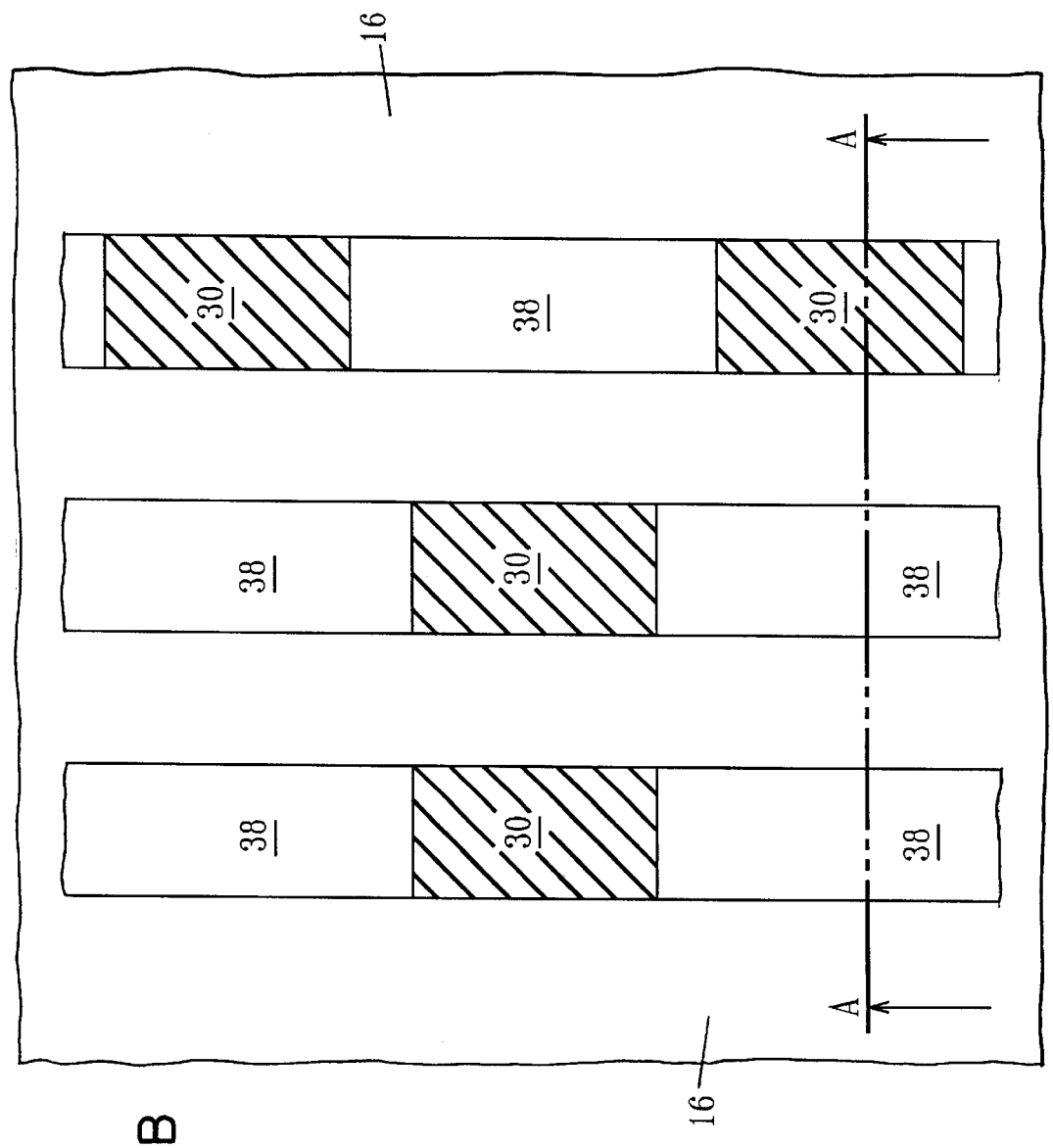

The remaining polysilicon in the top portion of the deep trench is recessed using a directional silicon etch which is selective to placeholder material 38 and nitride pad layer 16, and a layer of chemical vapor deposited oxide 40 is formed in the recessed area of the deep trench and then another planarization step is performed providing the structure shown in FIGS. 5A (cross-sectional view) and 5B (top view of FIG. 5A).

Figure 6:
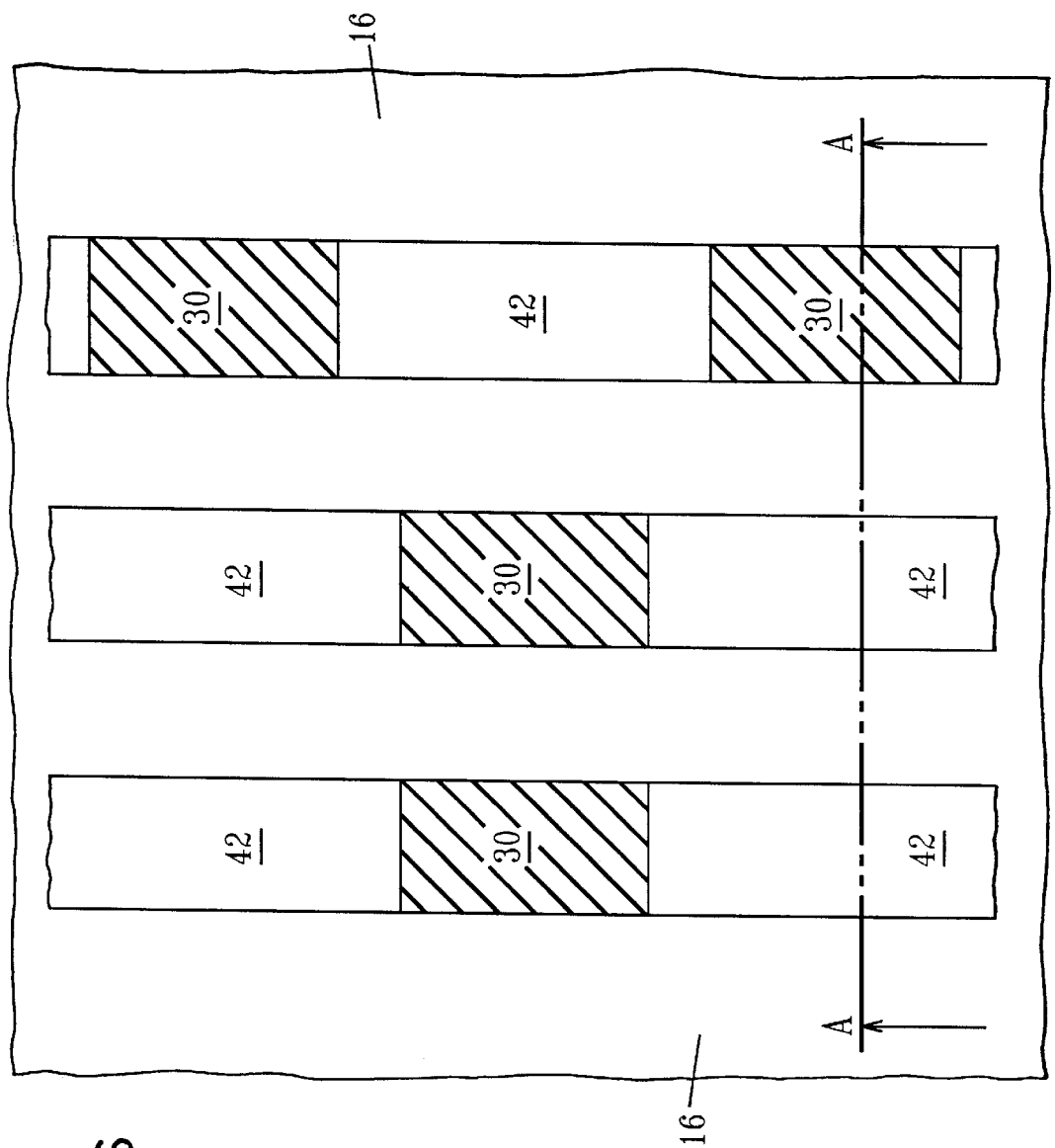

The placeholder material thus formed is then etched out using a conventional chemical etchant such as $H_2O_2$ that is selective to oxide and nitride. In customary manners well known to those skilled in the art, a sacrificial oxide is formed in the etched out regions of the structure, well dopings are made by ion implantation, the sacrificial oxide is stripped using a chemical etchant that is highly selective in removing the sacrificial oxide, a gate oxide 41 such as $SiO_2$ or nitride oxide is formed in the regions wherein the sacrificial oxide has been removed utilizing a conventional growing process or a conventional deposition processes, a gate conductor 42 such as polysilicon is deposited by conventional means and planarized. These steps of the present invention form wordline gate conductor 42 in the stripes that are adjacent to the deep trench region, See FIG. 6 (top view of the structure).

Figure 7:
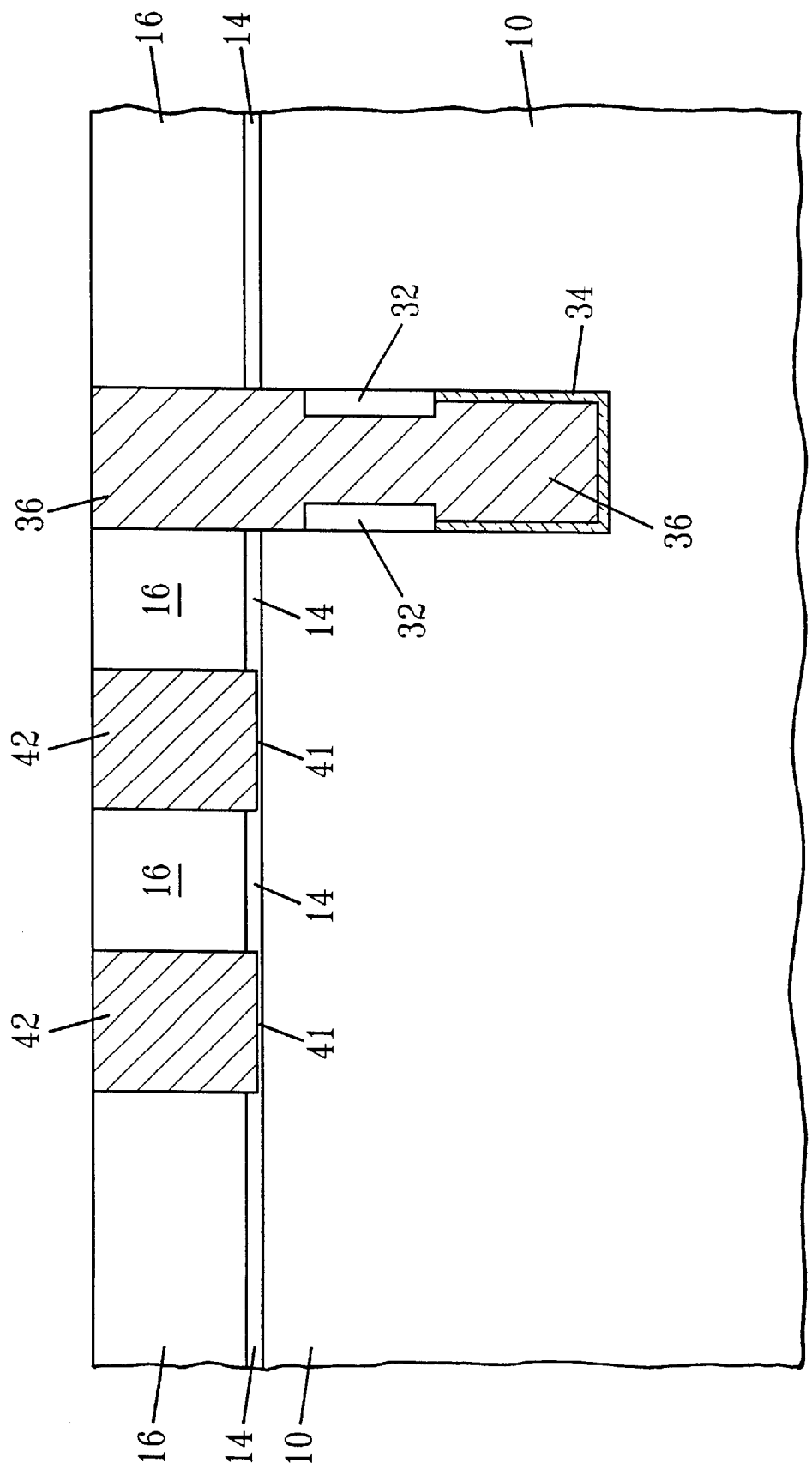

After formation of the gate region in the structure, oxide cap 40 over the deep trench is removed utilizing a conventional etching process that is selective to nitride and polysilicon. If necessary, the oxide etch may extend further into the collar region to assure that there is a sufficient opening to the semiconductor substrate for the subsequent formation of the buried-strap. Polysilicon or amorphous silicon 36, preferably undoped alpha-Si, is deposited by conventional techniques and then the structure is planarized (chemical-mechanical polishing) to nitride pad layer 16 of stack 12. These steps of the present invention result in the structure shown in FIG. 7.

Figure 8:
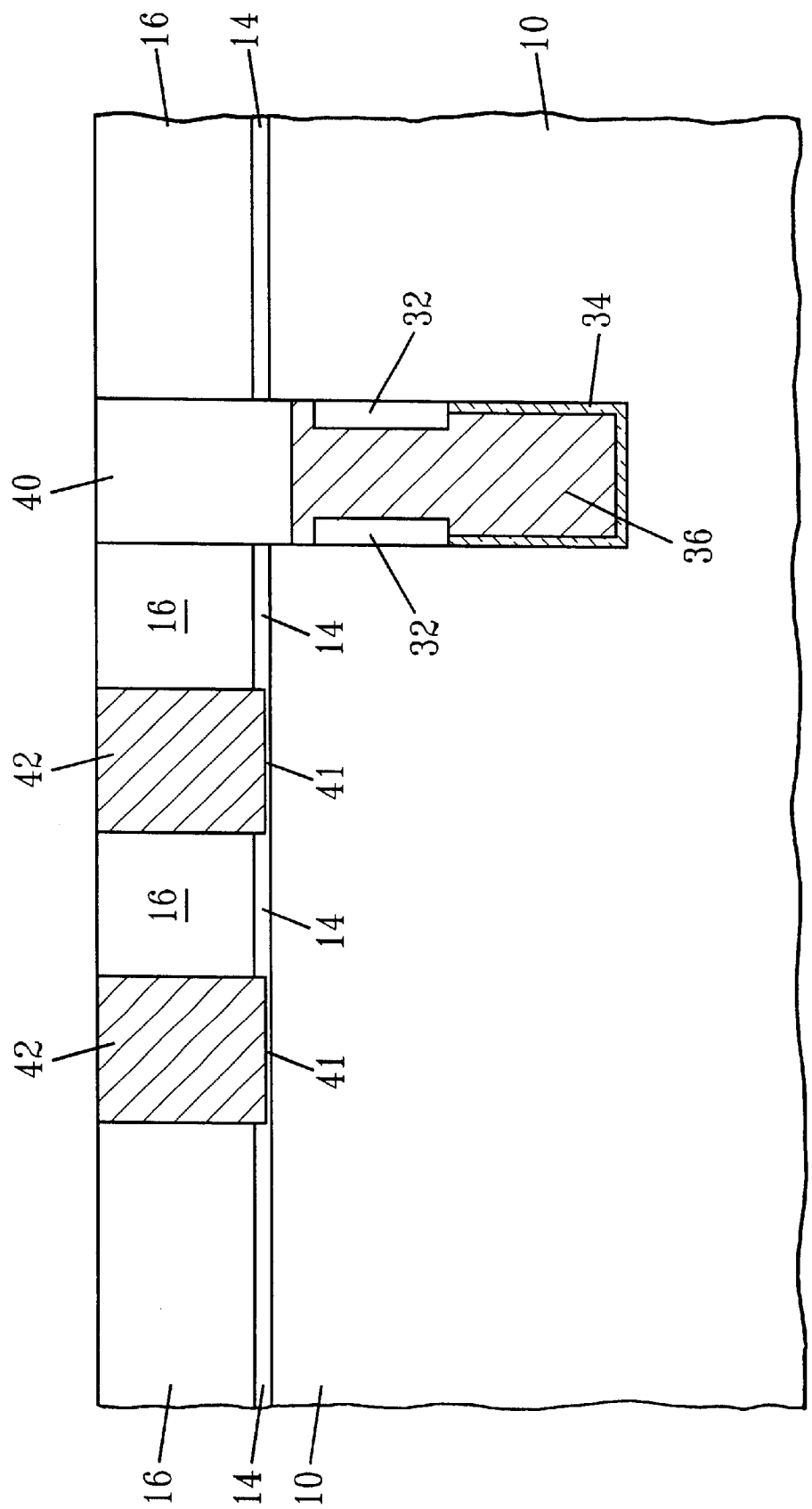

Using a mask, polysilicon 36 in the top portion of deep trench 30 is recessed using a polysilicon reactive ion etch which is selective to oxide and nitride to a depth which is slightly below the top surface of the semiconductor substrate, but above the top edge of collar region 32. Due to the overlap of the opening in the mask with wordline gate conductors 42, a portion of wordline gate conductor 42 is also removed. The etch through a portion of wordline gate conductor 42 is limited by gate oxide 41. The portion of the wordline gate conductor that is removed typically lies outside of the channel region of the array MOSFET which is subsequently formed and will be replaced by shallow trench isolation (STI). This assures that a strap opening is formed and that the wordline gate conductors, which are formed subsequently, are insulated from the deep trench polysilicon. The recess in the top is then filled with a chemical vapor deposited (CVD) oxide 40 and planarized to provide the structure shown in FIG. 8.

Figure 9:
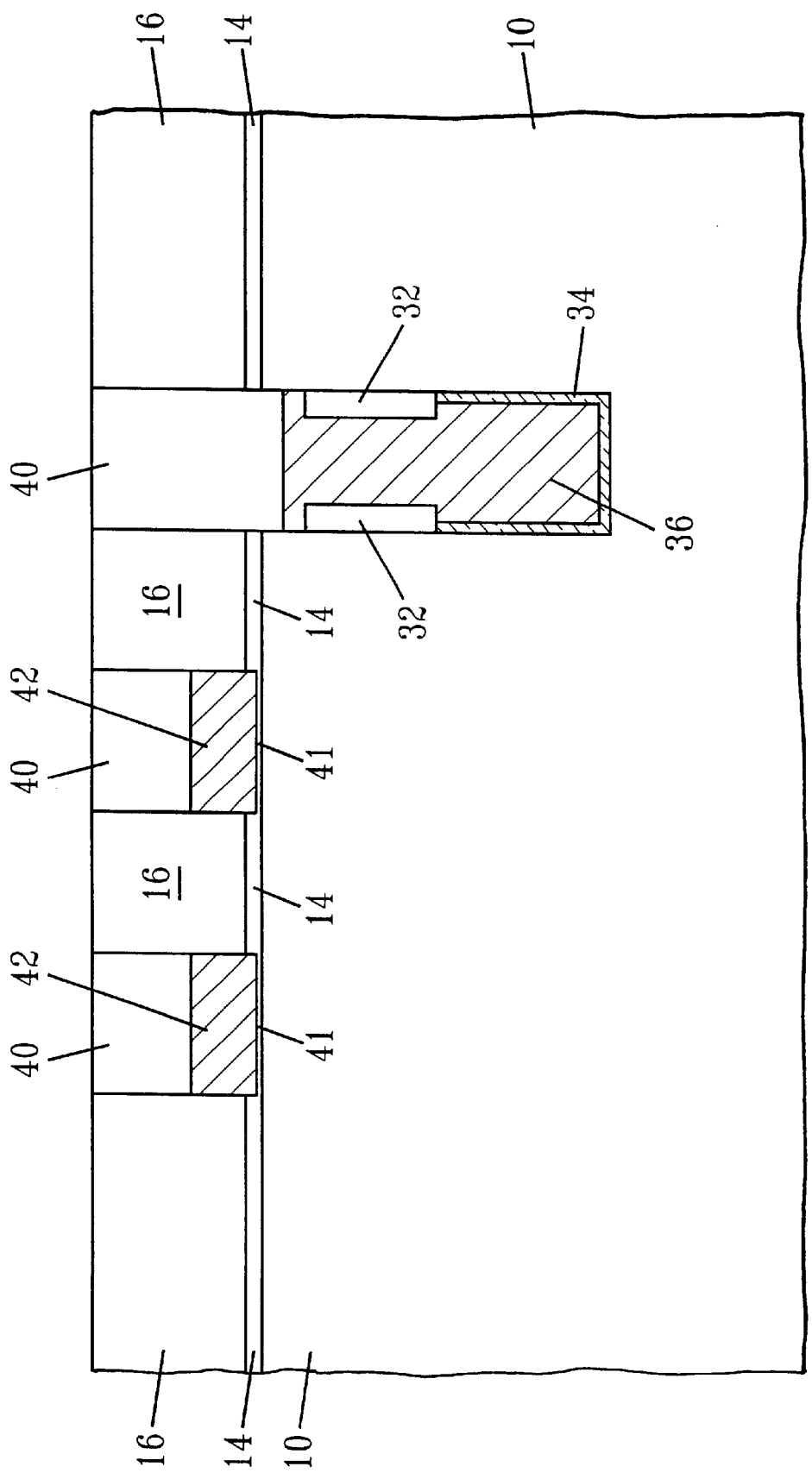

Following the capping of the deep trench with a CVD oxide, the gate conductor polysilicon may now be doped for the appropriate workfunction using any one of a variety of well known techniques including ion implantation, gas phase doping, plasma doping or doping from a solid source. It is noted that since the gate is doped independently of the source/drain regions, non-conventional devices such as P+gated NFETs and N+gated PFETS can be easily formed in the present invention. The exposed gate conductor polysilicon 42 is then recessed using a maskless process, selective to nitride and oxide, and an oxide cap 40 is formed thereon, See FIG. 9. The formation of an oxide cap on the gate conductor polysilicon is required for the subsequent contacting of the damascened wordline.

Figure 10:
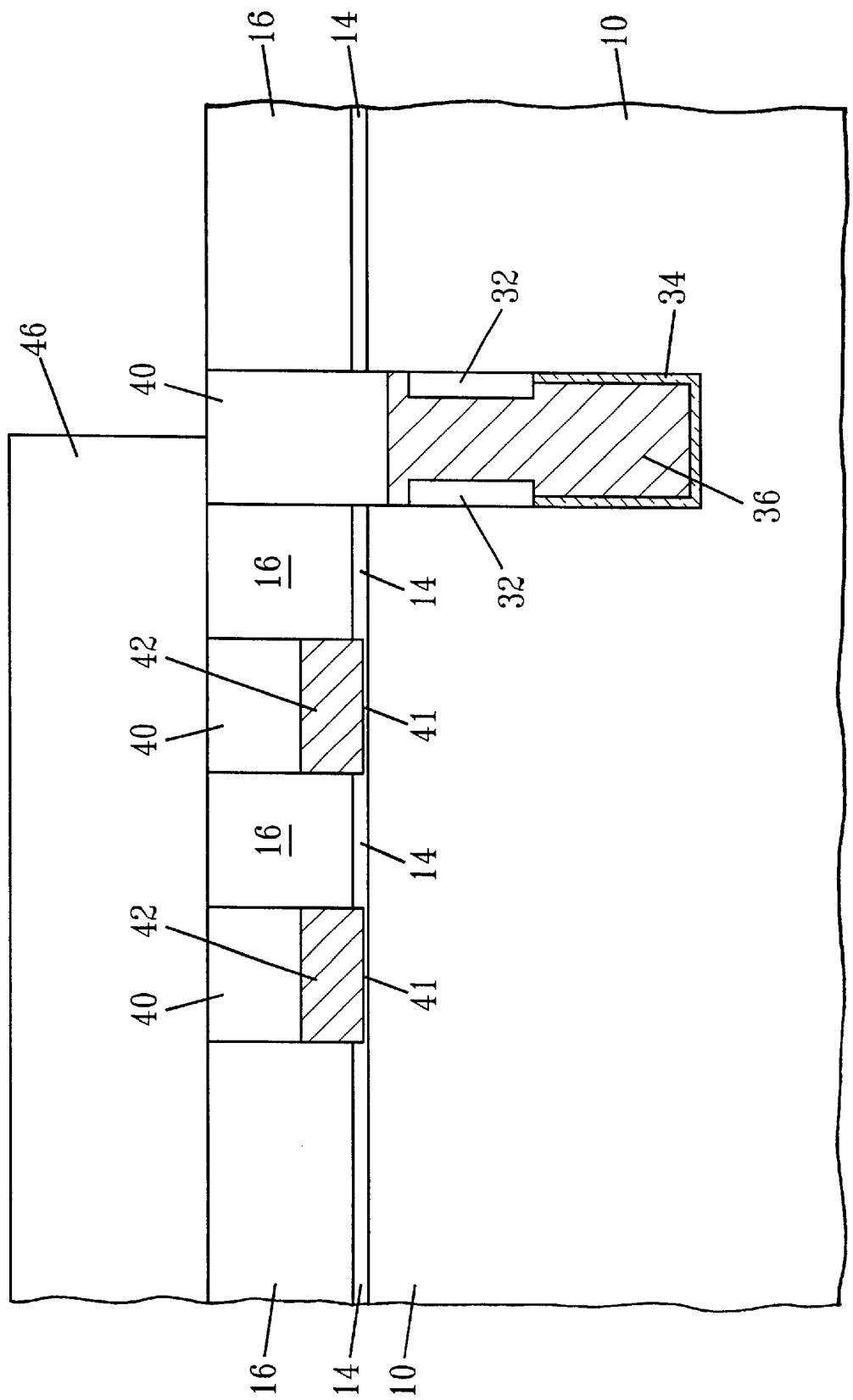

After capping the gate conductor polysilicon, the active areas of the structure are patterned utilizing photoresist 46, See FIG. 10. The exposed nitride and oxide of stack 12 and exposed oxide cap of the deep trench are subjected to RIE which continues into the semiconductor substrate to a depth that is below the bottom of the strap opening. A customary shallow trench isolation (STI) sidewall oxidation follows. The shallow trenches are then filled with a suitable dielectric material, i.e., CVD oxide, and planarized forming STI region 48 in the structure, See FIG. 11. If high density plasma tetraethylorthosilicate (TEOS) is used as the STI dielectric, a STI densification step is not required, reducing the thermal budget of the process.

Figure 12:
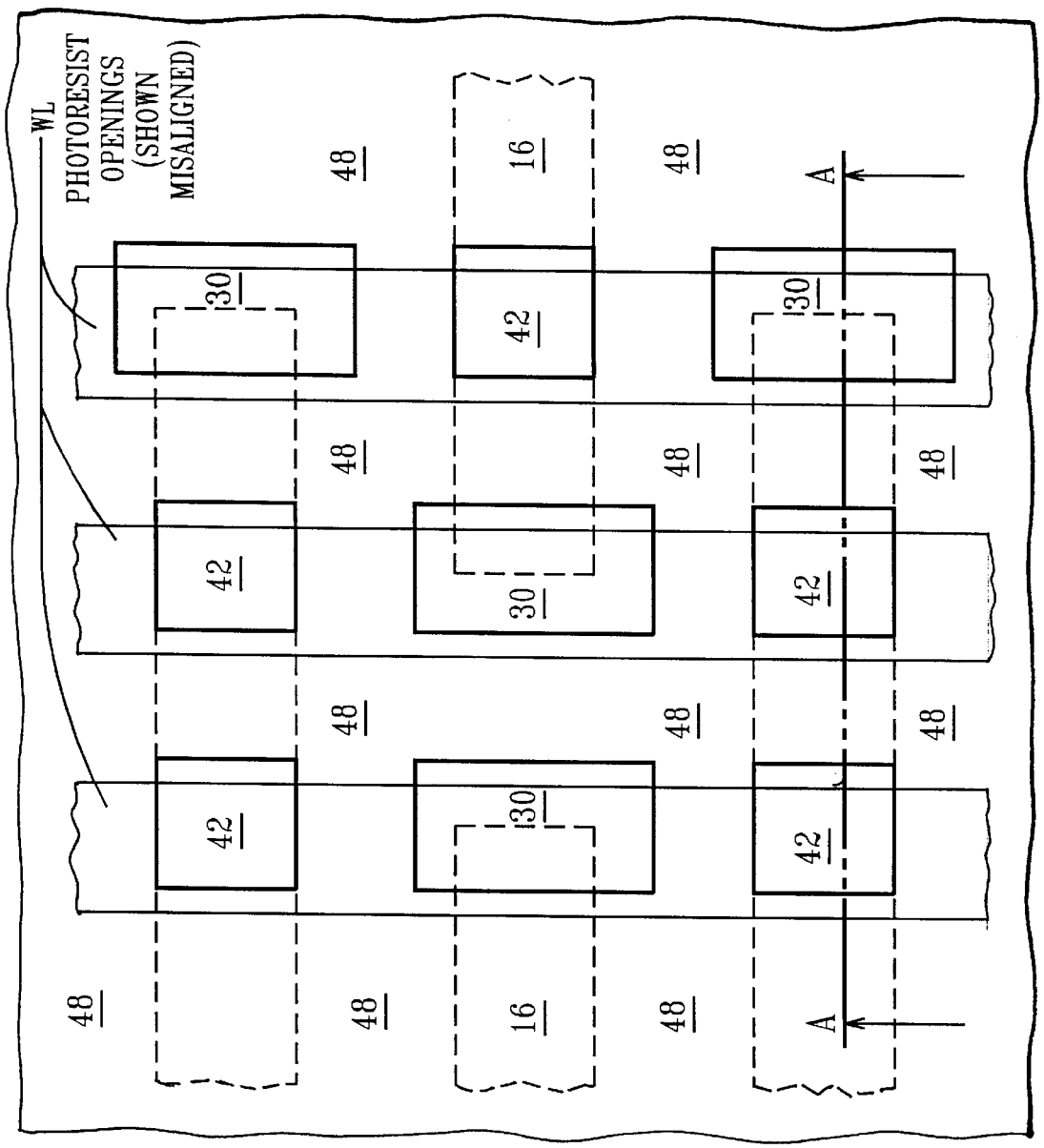

Following the formation of the STI region in the structure, a photoresist is deposited on the planarized surface of the structure and a pattern of stripes are formed in the photoresist such as is shown in FIG. 12. These stripes define the wordline pattern. In the support regions, the mask defines openings over the gate conductor polysilicon. These openings will allow the formation of a low resistance conductive layer over the gate conductor. Note that the wordline pattern is shown intentionally misaligned to demonstrate the robustness of the inventive self-aligned process.

Figure 13:
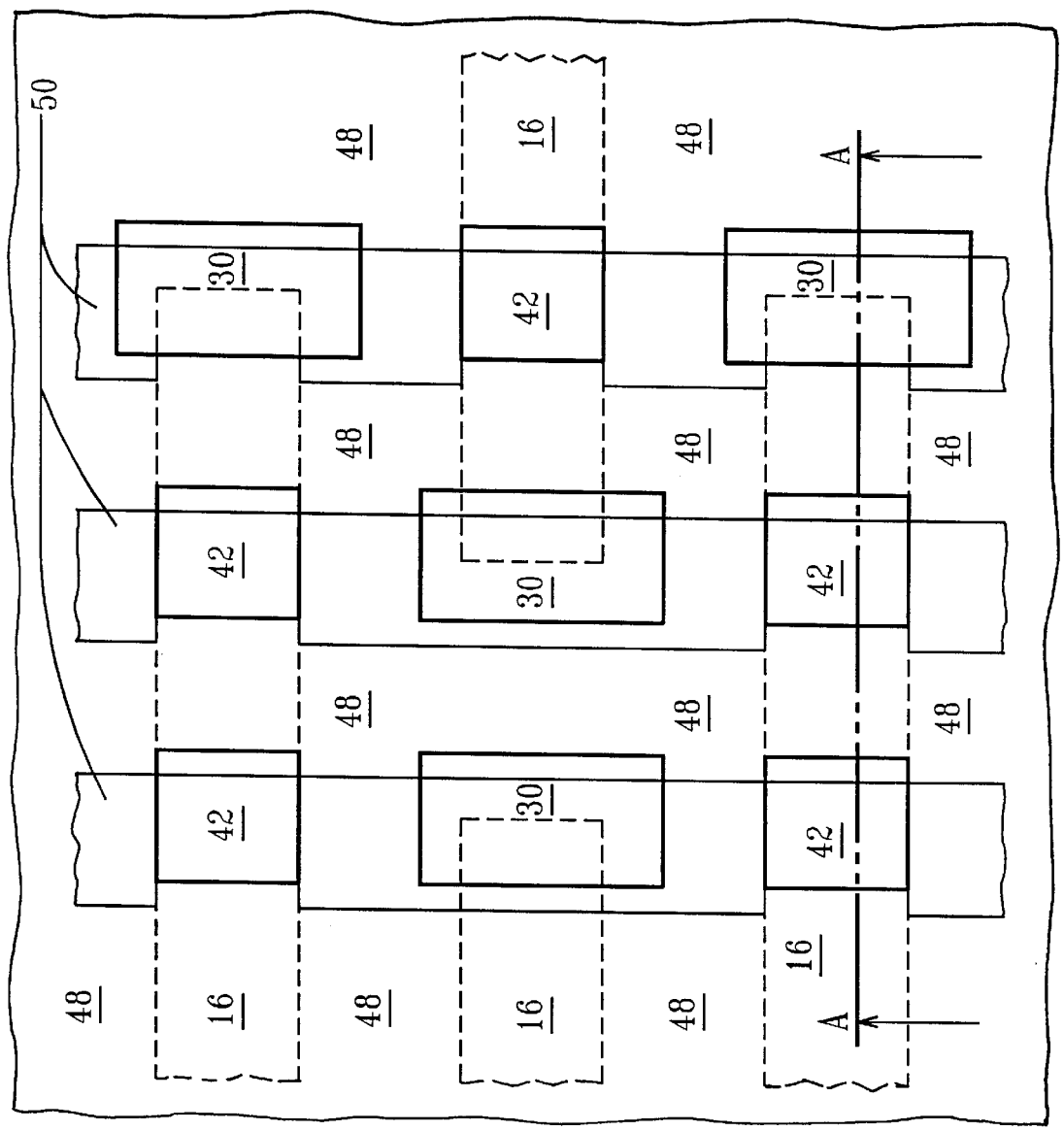

After patterning the wordlines in the photoresist, the exposed oxide is etched selective to nitride to a depth which is sufficient to expose a top surface of the gate conductor polysilicon. Since the oxide is etched selectively to the nitride, the edge of the recess over the active area is self-aligned to the underlying gate conductor polysilicon. Consequently, the present invention makes the distance of the edge of the gate conductor polysilicon to the edge of the adjacent deep trench independent of overlay since both of these edges were defined from the same mask. The recess is then filled with a suitable conductor such as tungsten and chemical-mechanical polished to the top surface of the nitride layer. The resultant structure formed from these processing steps is shown in FIG. 13. It is noted that these processing steps of the present invention define the wordline conductors 50. Moreover, the distance to the edge of the wordline gate conductor to the edge of the deep trench is independent of overlay. The support gate stack is also completed by this step.

Figure 14:
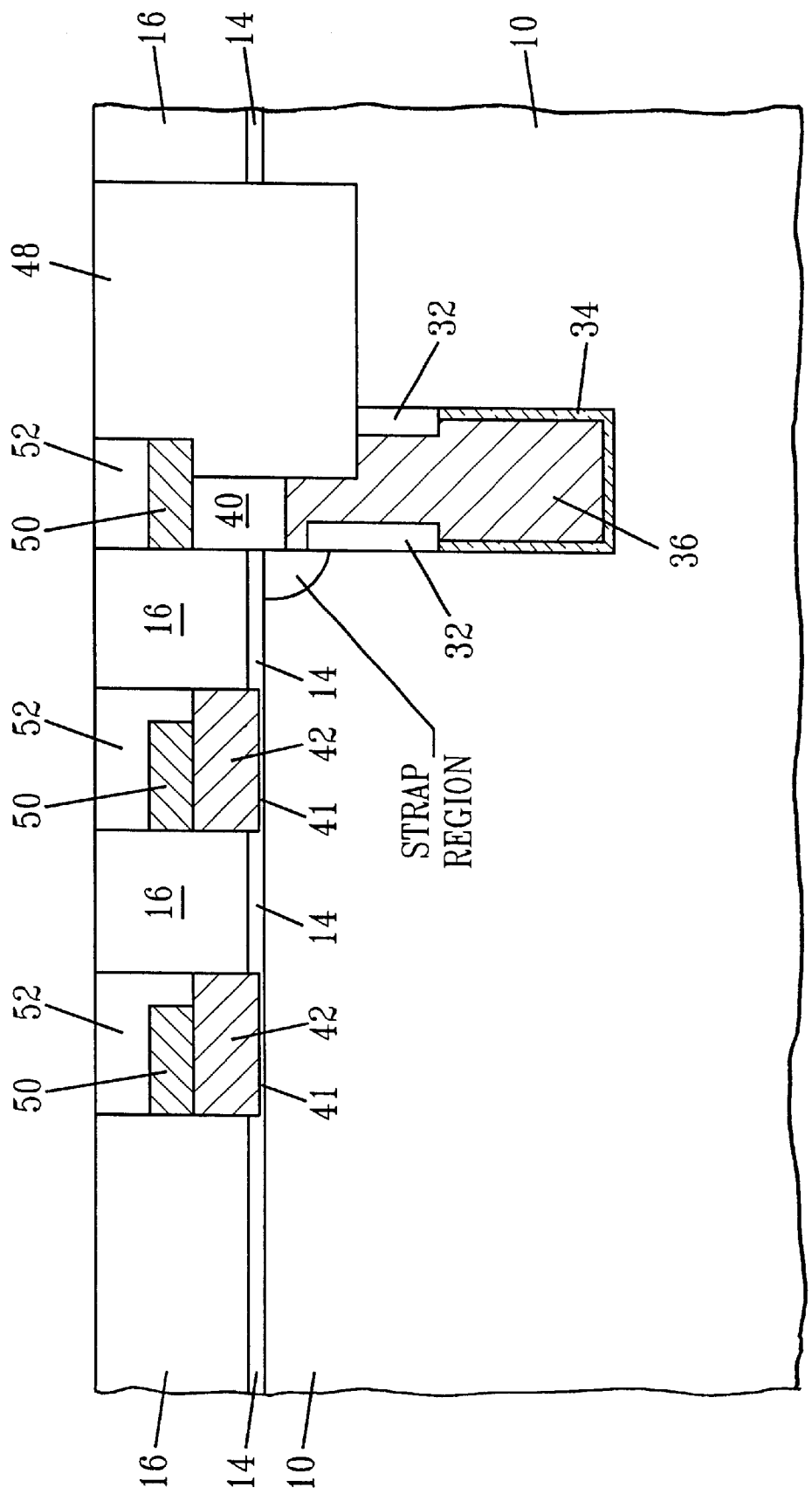

Following the formation of damascened wordlines 50, comnected to gate polysilicon 42 which is self-aligned to the storage trenches, the top surfaces of the conductive wordlines (and support gates) are recessed, selective to oxide and nitride, and capped with a CVD oxide 52, See FIG. 14.

Figure 15:
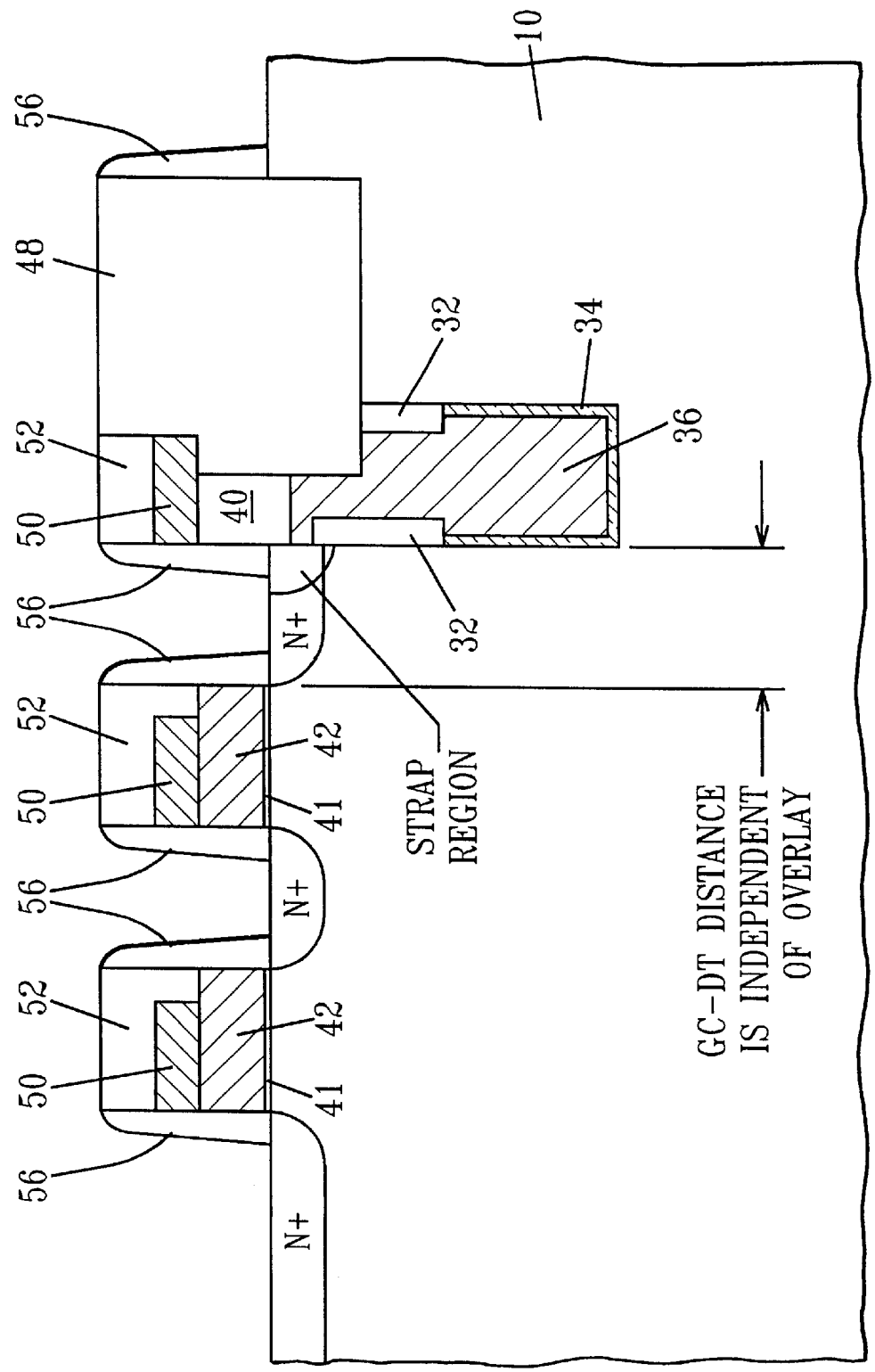

After the wordlines have been capped with CVD oxide, the remaining nitride pad is removed selective to oxide, exposing the surface of the semiconductor substrate. A conventional gate sidewall oxide may now be grown utilizing growing processes well known to those skilled in the art. Source/drain diffusion extensions are formed by either ion implantation or by other means such as gas phase doping, plasma immersion, implantation doping or solid source doping. Thick oxide spacers 56 having a preferred thickness of at least 15 nm are then formed on the structure using conventional deposition techniques and more heavily doped source/drain regions are introduced by using one of the above mentioned doping processes. The resultant structure formed from the above processing steps of the present invention is shown in FIG. 15.

Following doping of the source/drain diffusions and formation of the insulating spacers on the sidewalls of the gate and wordline conductors, a layer of boron silicate glass (BSG) may optionally be deposited utilizing conventional deposition techniques well known in the art and thereafter the structure is planarized. This optional step of the present invention is not shown in the accompanying drawings.

Openings are formed in the structure containing the planarized BSG layer for diffusion contacts utilizing conventional etching techniques well known in the art. These openings may be borderless to the edges of the wordlines since the BSG may be etched selectively to the other oxides which are more dense and have slower etch rates. Alternatively, other types of insulating films which provide enhanced etch selectivity may be substituted for BSG. Contact conductors (i.e., polysilicon, tungsten and the like) may be deposited on the structure and the structure may be planarized. Conventional processing as well known to those skilled in the art continues including bitline formation and higher wiring levels formation.

The above description, and FIGS. 1–15 illustrates one embodiment of the present invention wherein $8F^2$ memory cells are fabricated. In this first embodiment of the present invention, the gate conductor is formed in the same stripe as the trench capacitor.

MODIFICATION TO FIRST EMBODIMENT

Figure 3B:
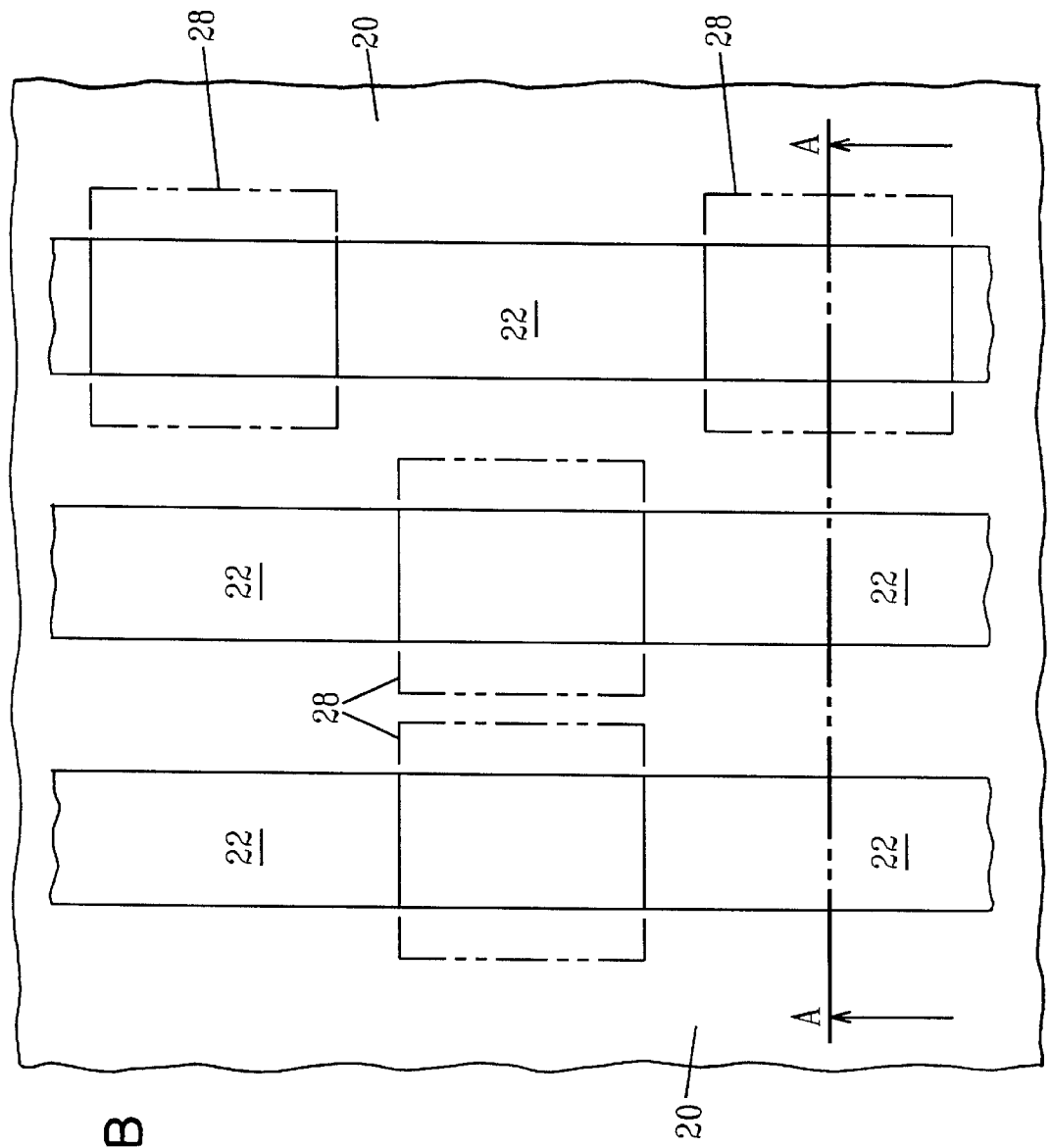
Figure 16:
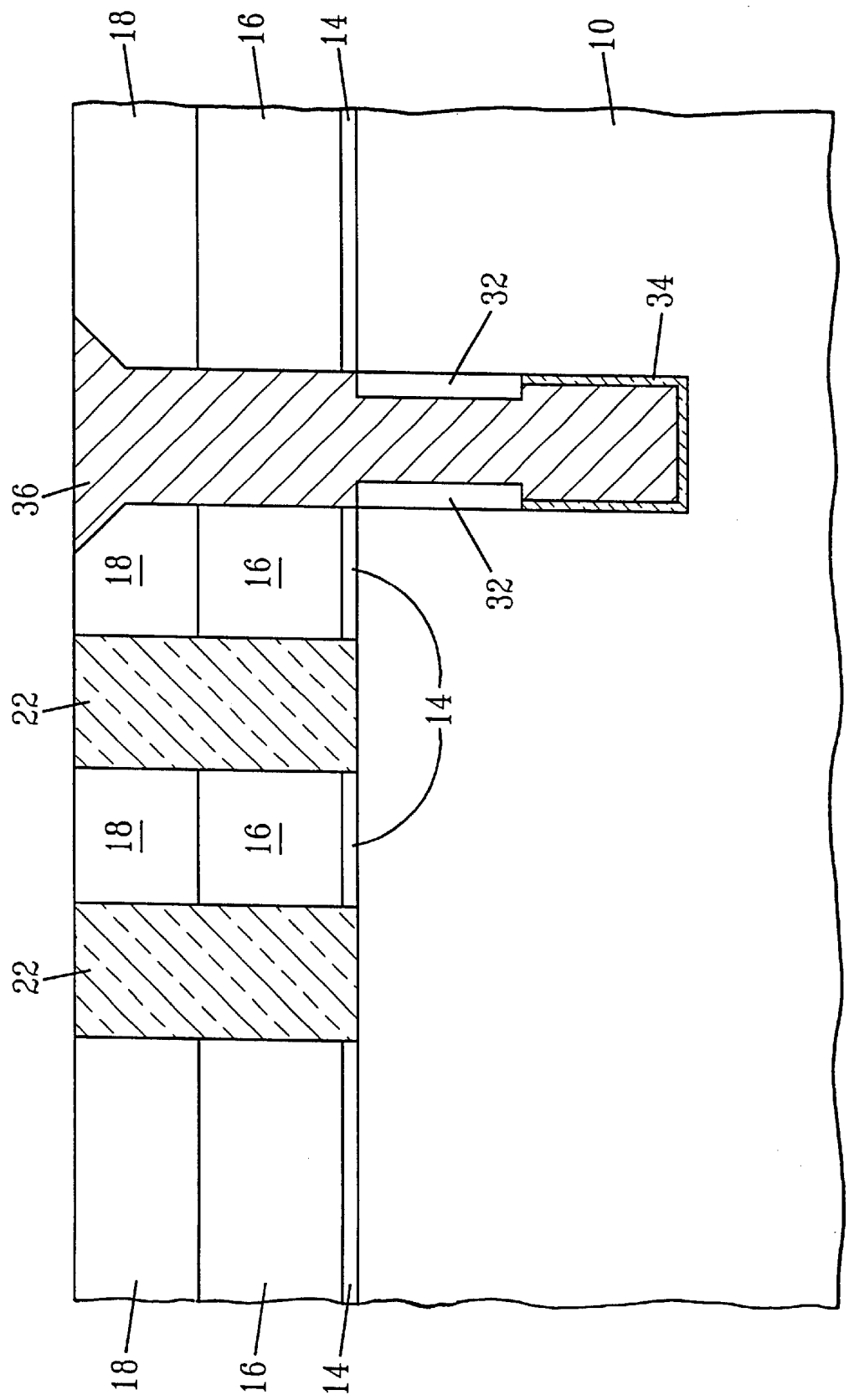
FIGS. 16–18 illustrate a modification which may be performed on the first embodiment of the present invention.

The first embodiment of the present invention may be modified using the following procedure: First, the process steps leading up to the structure shown in FIGS. 3A–3B are performed. The exposed filler material 22 in which the photoresist leaves uncovered is then reactive ion etched to the underlying semiconductor substrate surface, selective to topmost layer 20 of stack 12. The photoresist is removed and the deep trench is etched as described above. Next, customary deep trench processing follows, which includes formation of a buried-plate, collar 32, node dielectric 34, N+polysilicon 36 deposition, planarization and recess to a depth which is approximately at the level of the semiconductor substrate. A top portion of the exposed collar is then isotropically etched such that a small amount of the semiconductor substrate sidewall is exposed. Then, additional N+polysilicon 36 is deposited and planarized providing the structure shown in FIG. 16. During the course of the deep trench etching and planarization, topmost layer 20 of stack 12 is removed.

Figure 17:
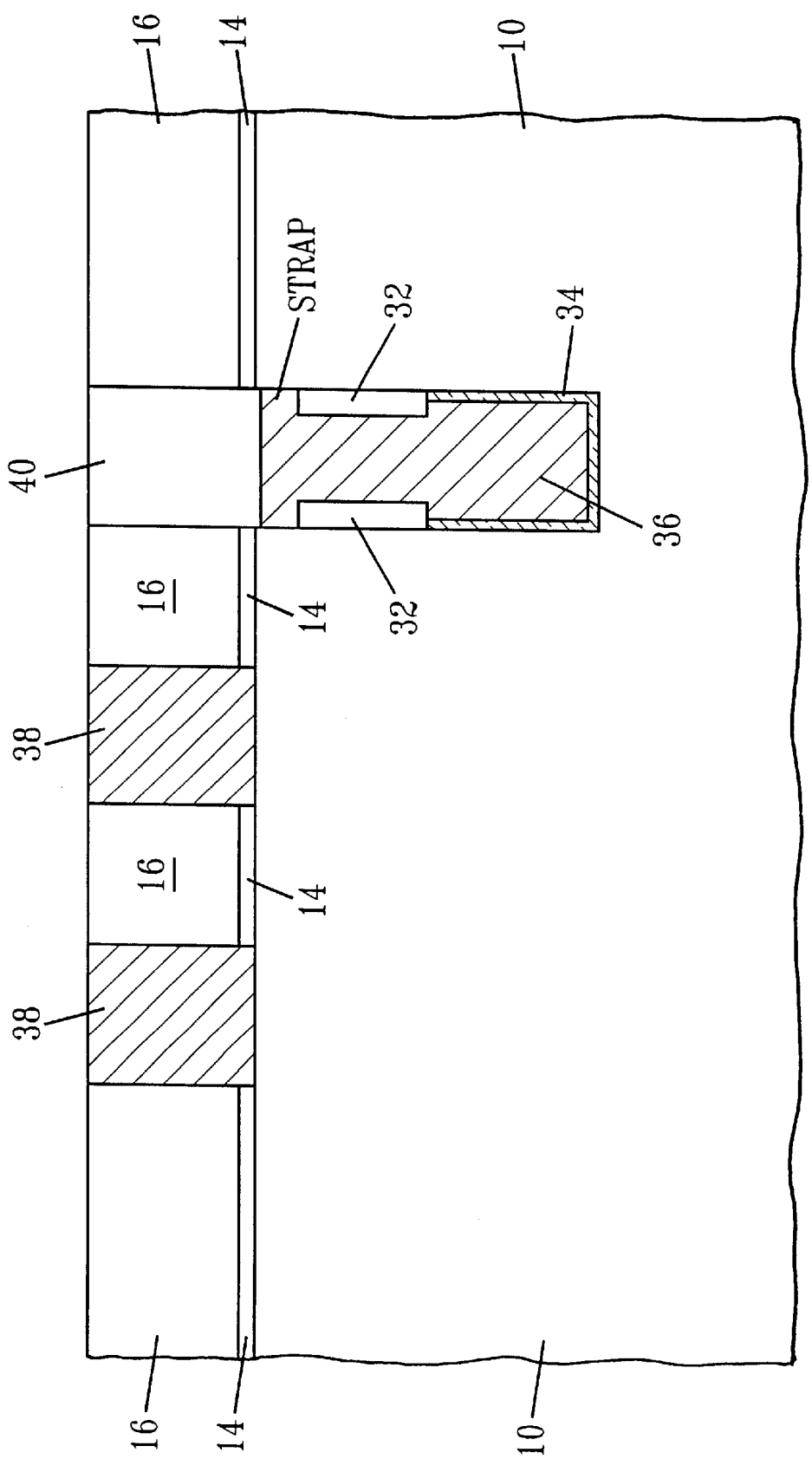

The filler material 22 (including the polysilicon in the top part of the deep trench) is planarized by chemical-mechanical polishing down to nitride layer 16. Stripes are then etched open to the underlying semiconductor substrate, selective to nitride and polysilicon. A placeholder material 38, e.g., tungsten, is deposited, filling the stripes (and the areas which will contain the MOSFETs in the support regions), and then planarized to the top surface of the nitride. The polysilicon in the top portion of the deep trench is then recessed using a directional etch which is selective to the placeholder material and nitride. The recess depth of the polysilicon is adjusted such that a portion of the polysilicon remains above the top of the oxide collar to form a strap. Then, a layer of CVD oxide 40 is deposited and planarized providing the structure shown in FIG. 17.

Figure 18:
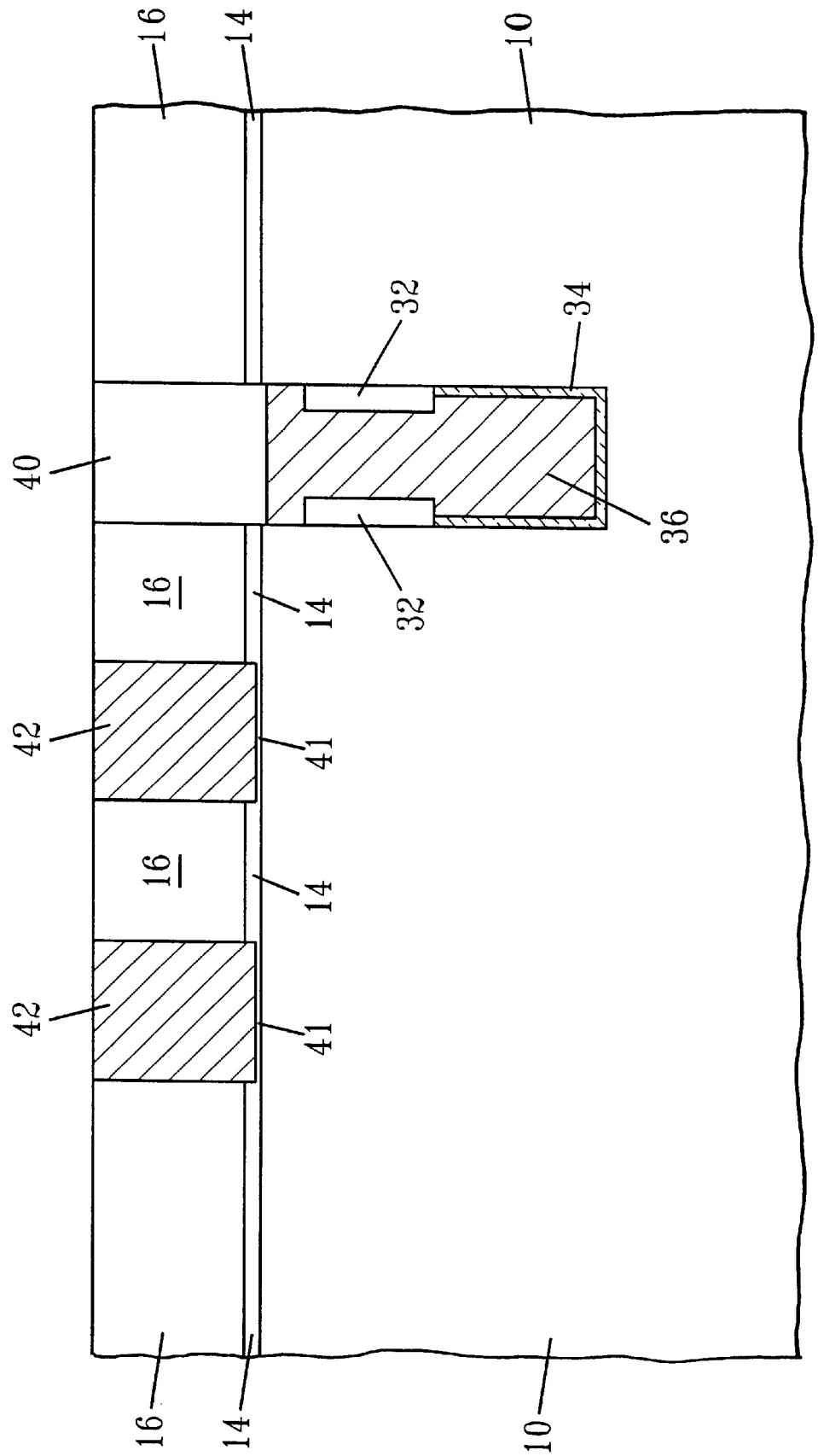

The placeholder material is then etched out selective to oxide and nitride using a wet etch ($H_2O_2$) process. In the customary manner, a sacrificial oxide is grown, well implants are made, the sacrificial oxide is stripped, a gate oxide 41 is formed, a gate conductor material 42 is deposited and then the structure is planarized providing the structure shown in FIG. 18.

The gate conductor polysilicon may now be doped for the appropriate workfunction using any one of a variety of well known techniques including ion implantation, gas phase doping, plasma doping or doping from a solid source. It is noted that since the gate is doped independently of the source/drain regions, non-conventional devices such as P+gated NFETs and N+gated PFETS can be easily formed in the present invention.

The following steps in this embodiment of the present invention are similar to the ones shown in FIGS. 10–15 above. Specifically, the active areas of the structure are patterned utilizing a photoresist as described hereinabove. The exposed nitride and oxide of the stack are subjected to RIE which continues into the semiconductor substrate to a depth that is below the bottom of the strap opening. A customary shallow trench isolation (STI) sidewall oxidation follows. The shallow trenches are then filled with a suitable dielectric material, i.e., CVD oxide, and planarized forming an STI region in the structure.

Figure 11:
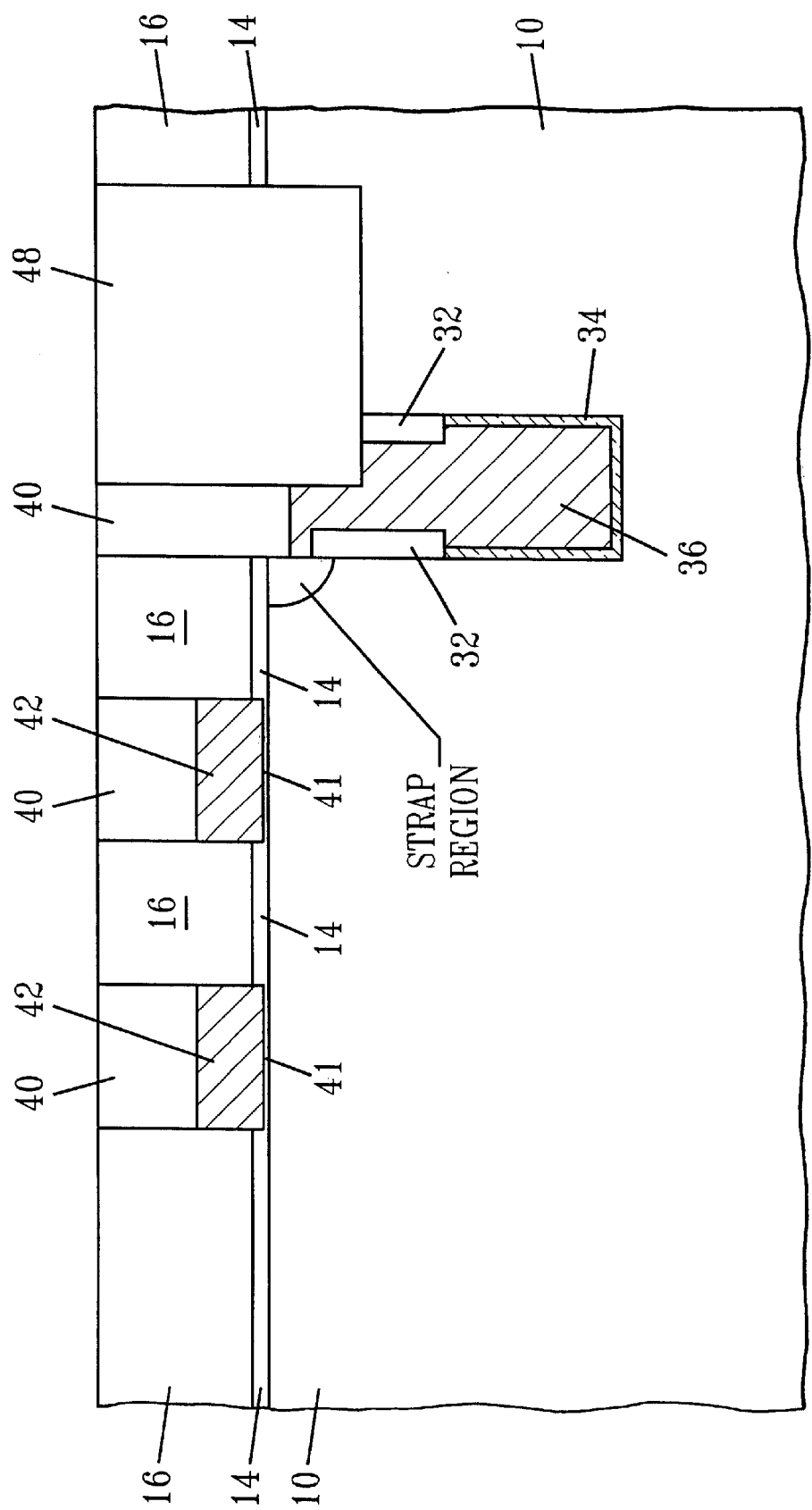

Following the formation of the STI region in the structure, a layer of photoresist is deposited on the planarized surface of the structure and a pattern of stripes are formed in the photoresist such as was previously shown in FIG. 11. These stripes define the wordline pattern. In the support region, the mask defines openings over the gate conductor polysilicon. These openings will allow the formation of a low resistance conductive layer over the gate conductor.

After patterning the wordlines in the photoresist, the exposed oxide is etched selective to nitride to a depth which is sufficient to expose a top surface of the gate conductor polysilicon. Since the oxide is etched selectively to the nitride, the edge of the recess (and the edge of the wordline conductor) over the active area does not extend past the edge of the underlying gate conductor. This facilitates the subsequent formation of bitline contacts. The recess is then filled with a suitable conductor such as tungsten and chemical-mechanical polished to the top surface of the nitride layer. It is noted that these processing steps of the present invention define the wordline conductors. As stated earlier, the distance from the edge of the gate conductor to the edge of the deep trench is independent of overlay since both deep trench and gate conductor have been defined by a common mask. The support gate stack is also completed by this step.

Following the formation of the damascened wordlines, the top surfaces of the conductive wordlines (and support gates) is recessed, selective to oxide and nitride, and capped with a CVD oxide.

After the wordlines have been capped with CVD oxide, the remaining nitride pad is removed selective to oxide, exposing the surface of the semiconductor substrate. A conventional gate sidewall oxide may now be grown utilizing growing processes well known to those skilled in the art. Source/drain diffusion extensions are formed by either ion implantation or by other means such as gas phase doping, plasma immersion, implantation doping or solid source doping. Thick oxide spacers are then formed on the structure using conventional deposition techniques and more heavily doped source/drain regions are introduced by using one of the above mentioned doping processes.

Following doping of the source/drain diffusions and formation of the insulating spacers on the sidewalls of the gate and wordline conductors, a layer of boron silicate glass (BSG) may optionally be deposited utilizing conventional deposition techniques well known in the art and thereafter the structure is planarized.

Openings are formed in the structure for diffusion contacts utilizing conventional etching techniques well known in the art. These openings may be borderless to the edges of the wordlines since the BSG may be etched selectively to the other oxides which are more dense and have slower etch rates. Alternatively, barrier insulating films such as nitride films which provide enhanced etch selectivity may be used between the BSG and the structure of the present invention. Such processing steps are all well known in the art. Contact conductors (i.e. polysilicon, tungsten and the like) may be deposited on the structure and planarized. Conventional processing as well known to those skilled in the art continues including bitline formation and higher wiring levels formation.

SECOND EMBODIMENT

In a second embodiment of the present invention, the gate conductor is formed in spaces between the stripes or blocks in which the trench capacitor is formed. The second embodiment will now be described in greater detail.

Figure 19:
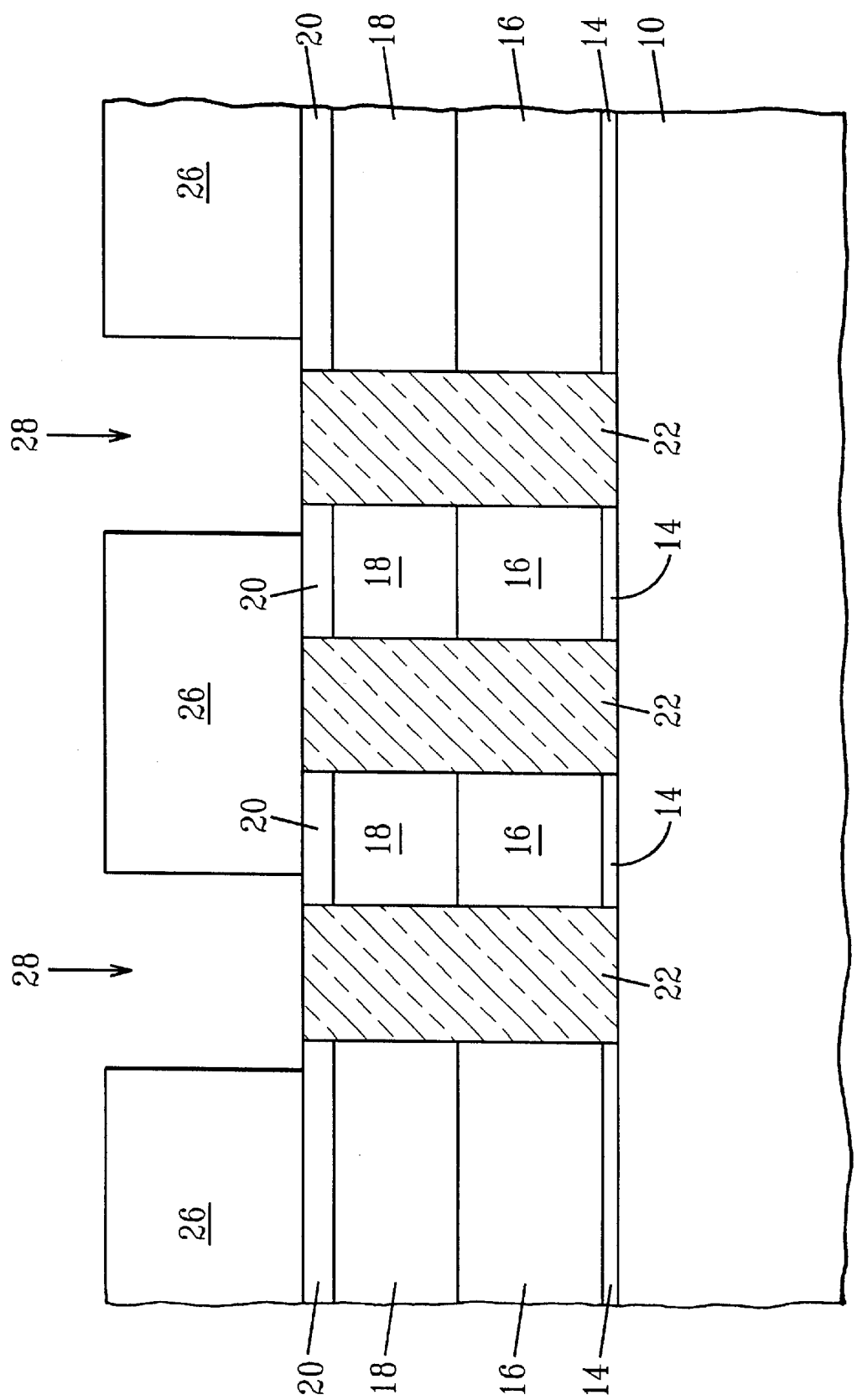
Figure 20:
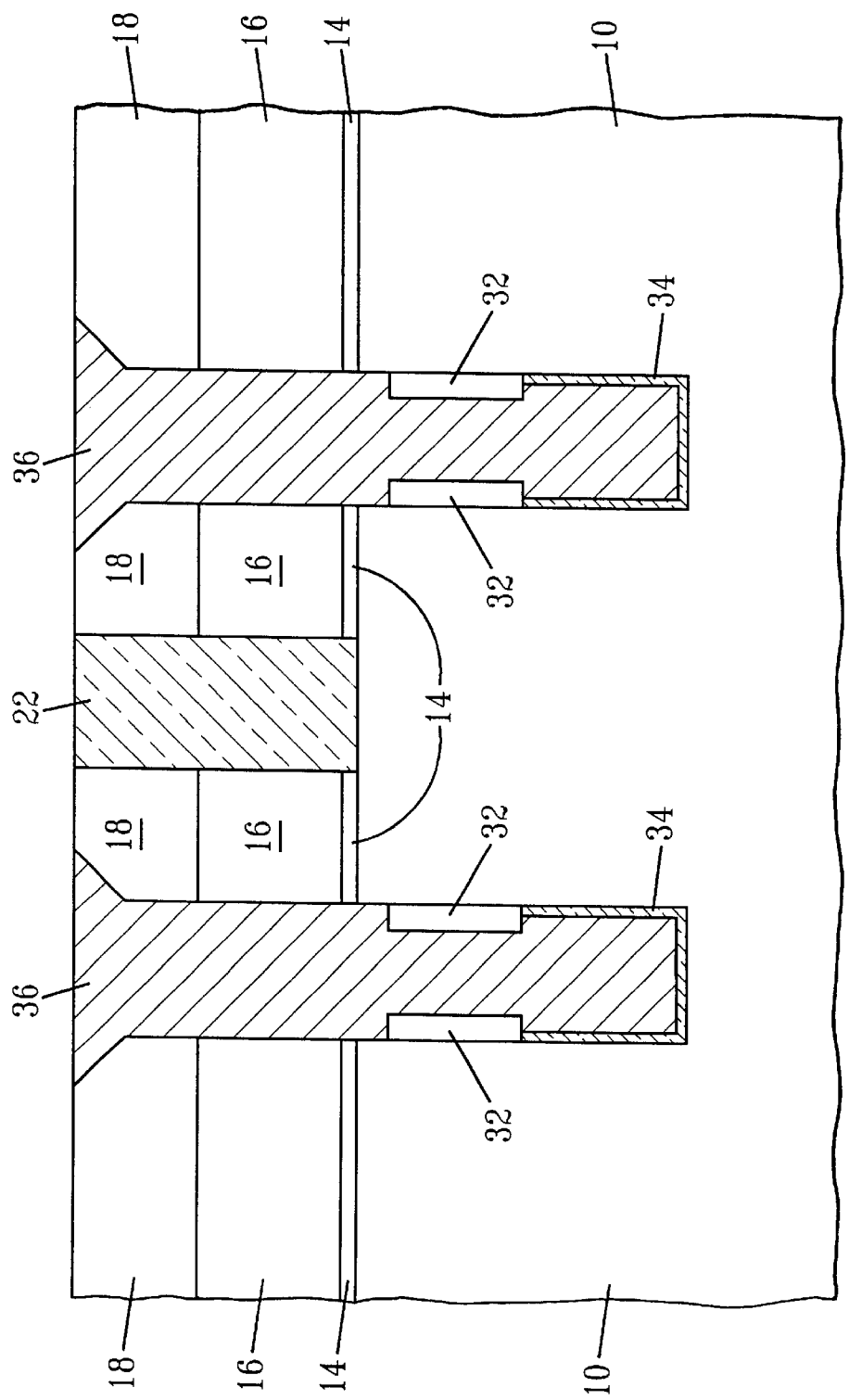

In accordance with the second embodiment of the present invention, the processing though FIGS. 1–2A and 2B are first performed and the processing steps depicted in FIGS. 19–29 are then performed. Specifically, as shown in FIG. 19, deep trenches are formed in the structure utilizing stack 12 and photoresist 26. This defines opening in the stripes containing filler material 22 for the formation of the storage trench.

Figure 21A:
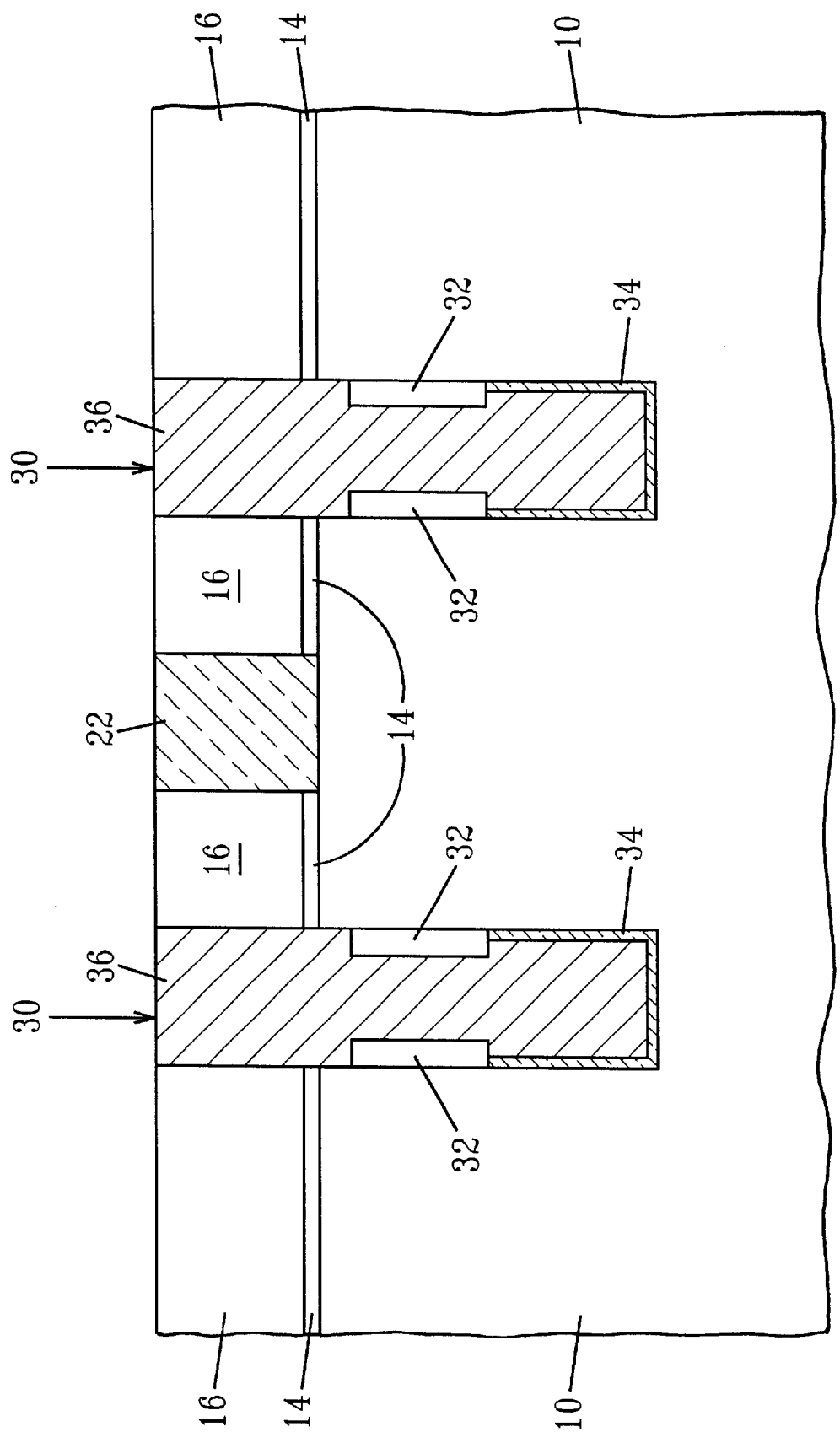
Figure 21B:
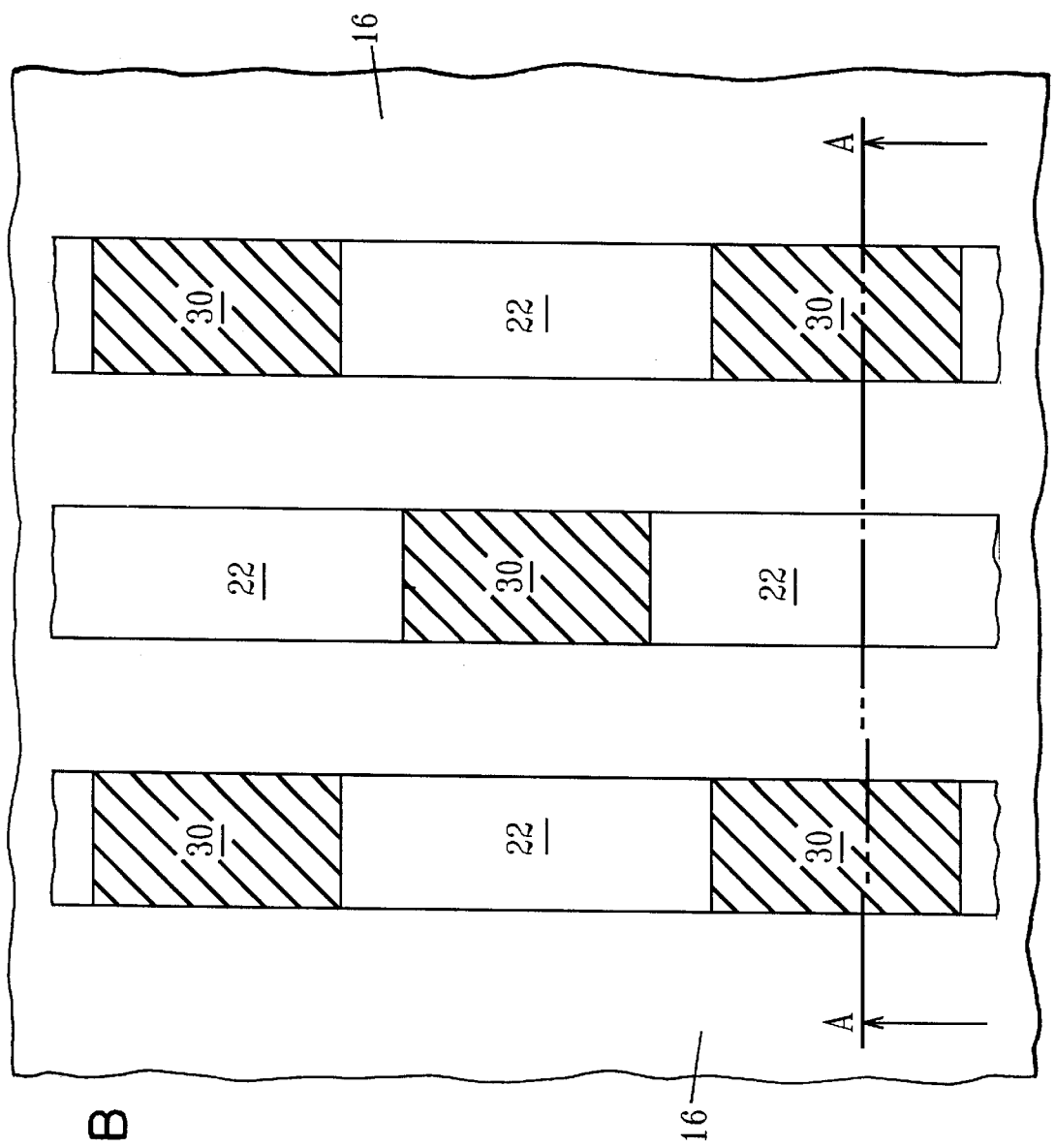
Figure 22:
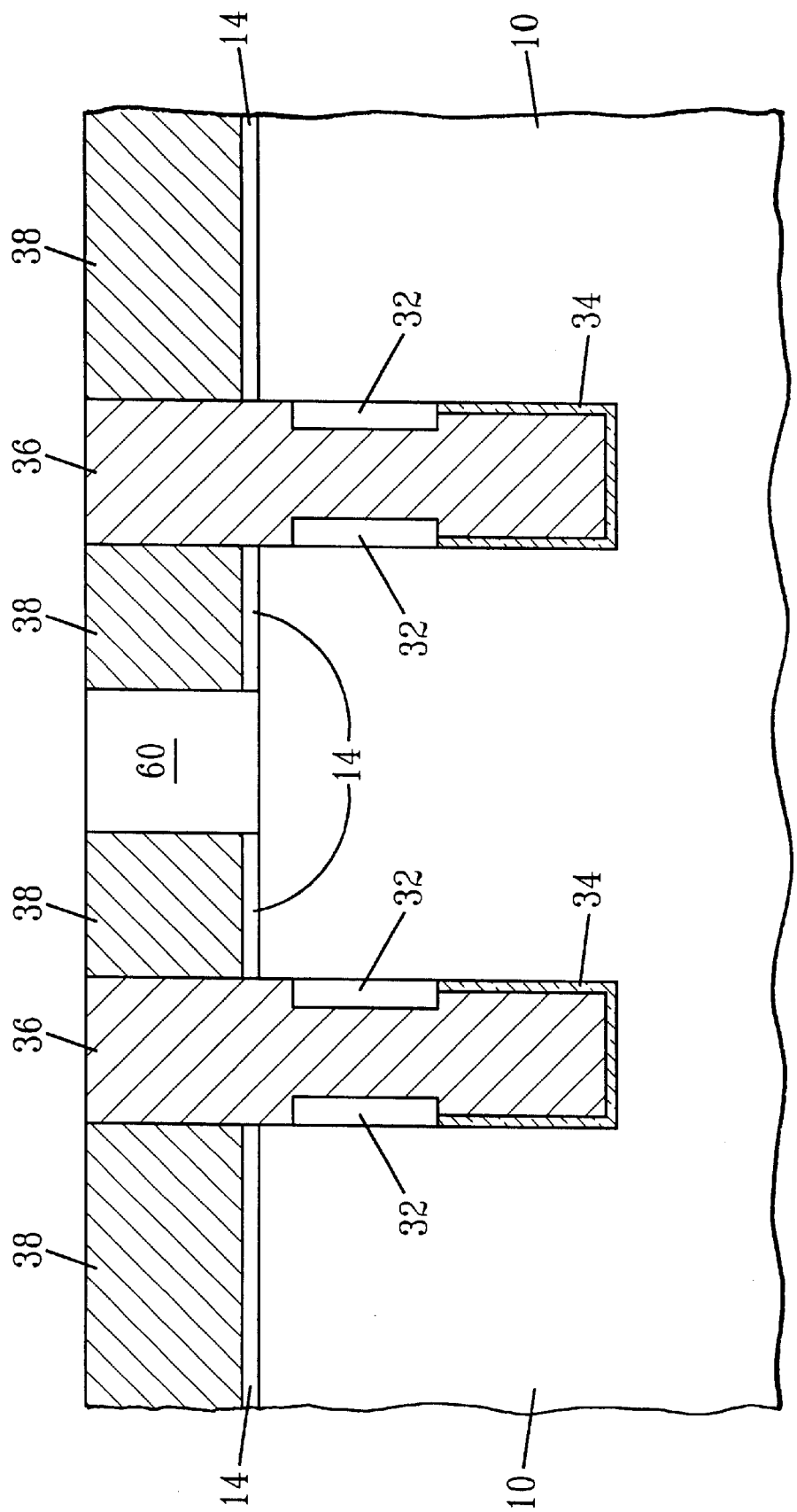
Figure 23A:
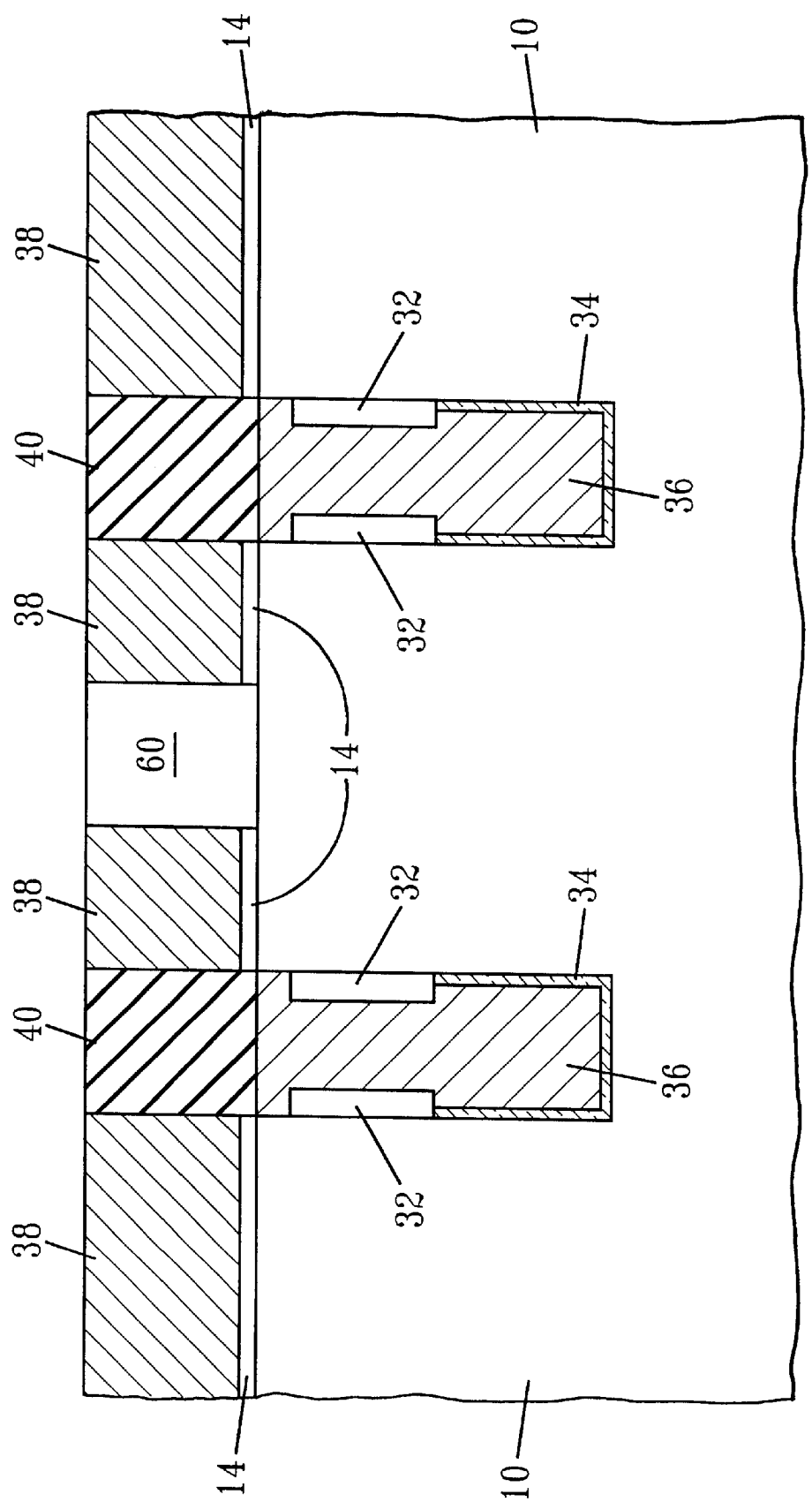
Figure 23B:
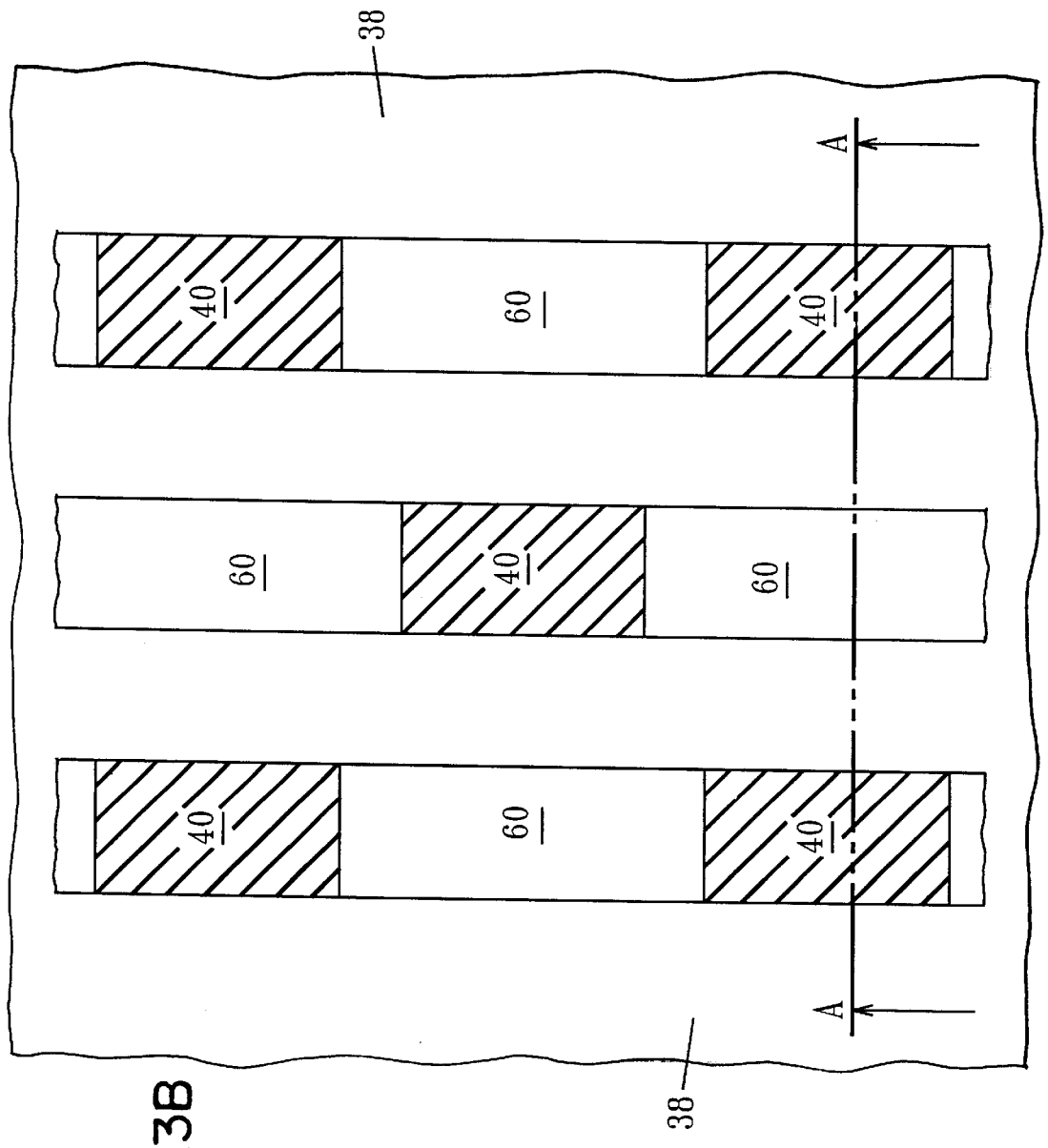

The exposed filler material is then etched as described above and the deep trenches are also processed in the manner described above forming the structure shown in FIG. 20. Next, as shown in FIG. 21A (cross-sectional view) and 21B (top view), the oxide layer of the stack is chemical-mechanically polished down to nitride pad layer 16.

After polishing down to nitride pad layer 16, the nitride pad layer is etched out selectively to polysilicon and oxide using either a wet etch process (e.g., hot phosphoric acid) or a selective RIE process. A placeholder material 38, i.e., tungsten, is then deposited and planarized to the top surfaces of the oxide and the polysilicon regions.

The regions containing filler material 22 are then etched out selectively to polysilicon and the placeholder material utilizing for example RIE. A layer of CVD nitride 60 is then deposited filling the openings provided above and then that structure is planarized to remove the nitride from above the polysilicon and the placeholder material, see FIG. 22. During the planarization operation, a small amount of the polysilicon and the placeholder material may be safely removed.

Next, an anisotropic etch that is selective to the placeholder material and nitride is performed to recess the exposed polysilicon in the deep trench to about approximately the level of the semiconductor substrate. This recess etch must assure that a portion of the deep trench polysilicon still remains above the top of the collar oxide to provide a strap connection. Then, a layer of CVD oxide 40 is deposited and planarized (See FIGS. 23A (cross-sectional view) and 23B (top view)).

The placeholder material is then etched out selective to oxide and nitride using a conventional wet etch process. In a customary manner known to those skilled in the art, a sacrificial oxide is grown in the deep trench, well implants are made, the sacrificial oxide is stripped, a gate oxide 41 is formed, a gate conductor 42 is deposited and the structure is planarized. The gate conductor is then doped as described above and the gate conductor is recessed and capped with a CVD oxide 40 using well known methods providing the structure shown in FIG. 24. The support areas are processed with these steps of the present invention. During the sacrificial oxide and gate oxide hot processing steps, outdiffusion of dopant from the deep trench polysilicon through the strap and into the semiconductor substrate occurs. This outdiffusion forms one of the source/drain diffusions (the storage node diffusion) of the MOSFET.

Figure 25:
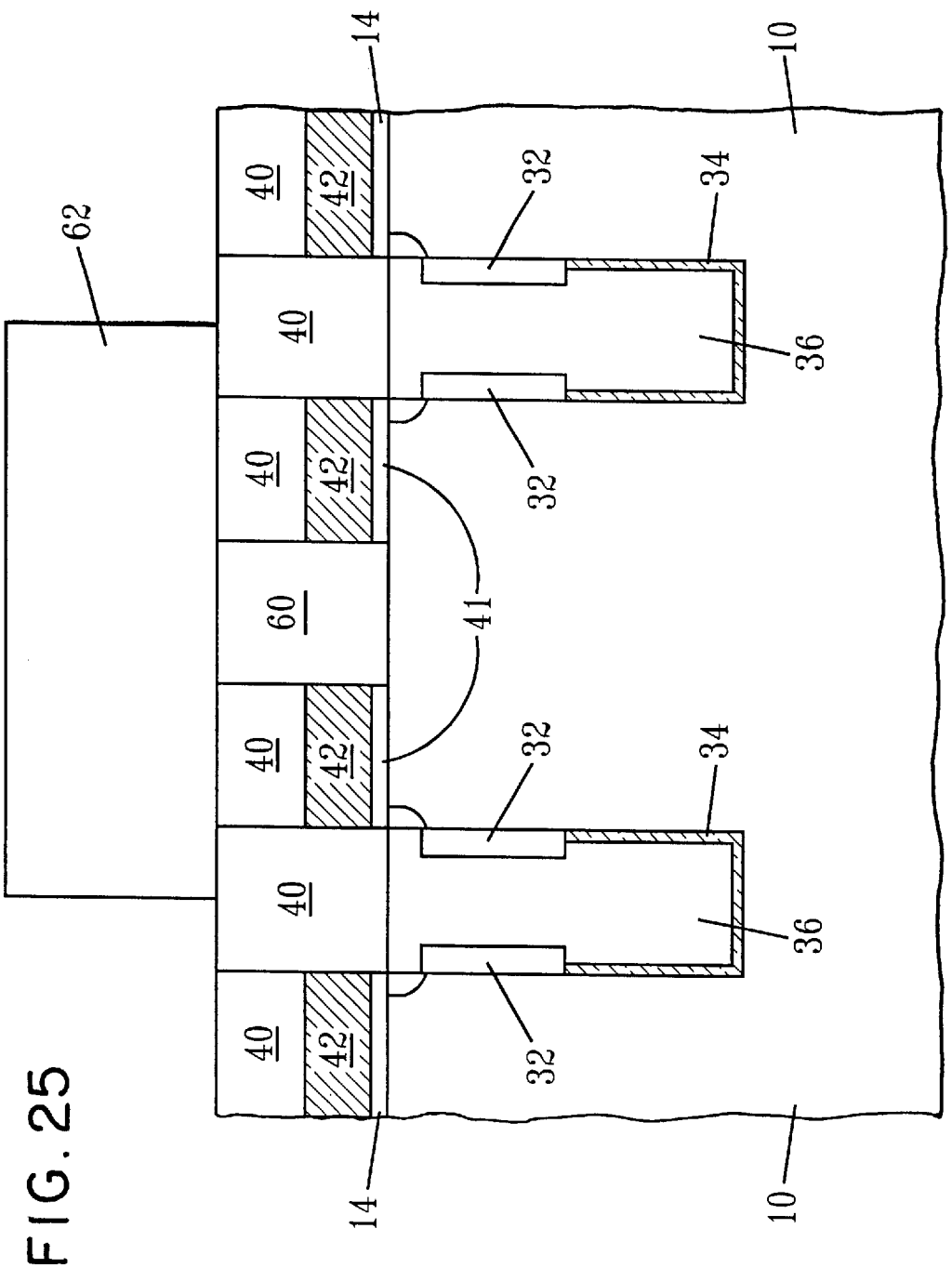
Figure 26:
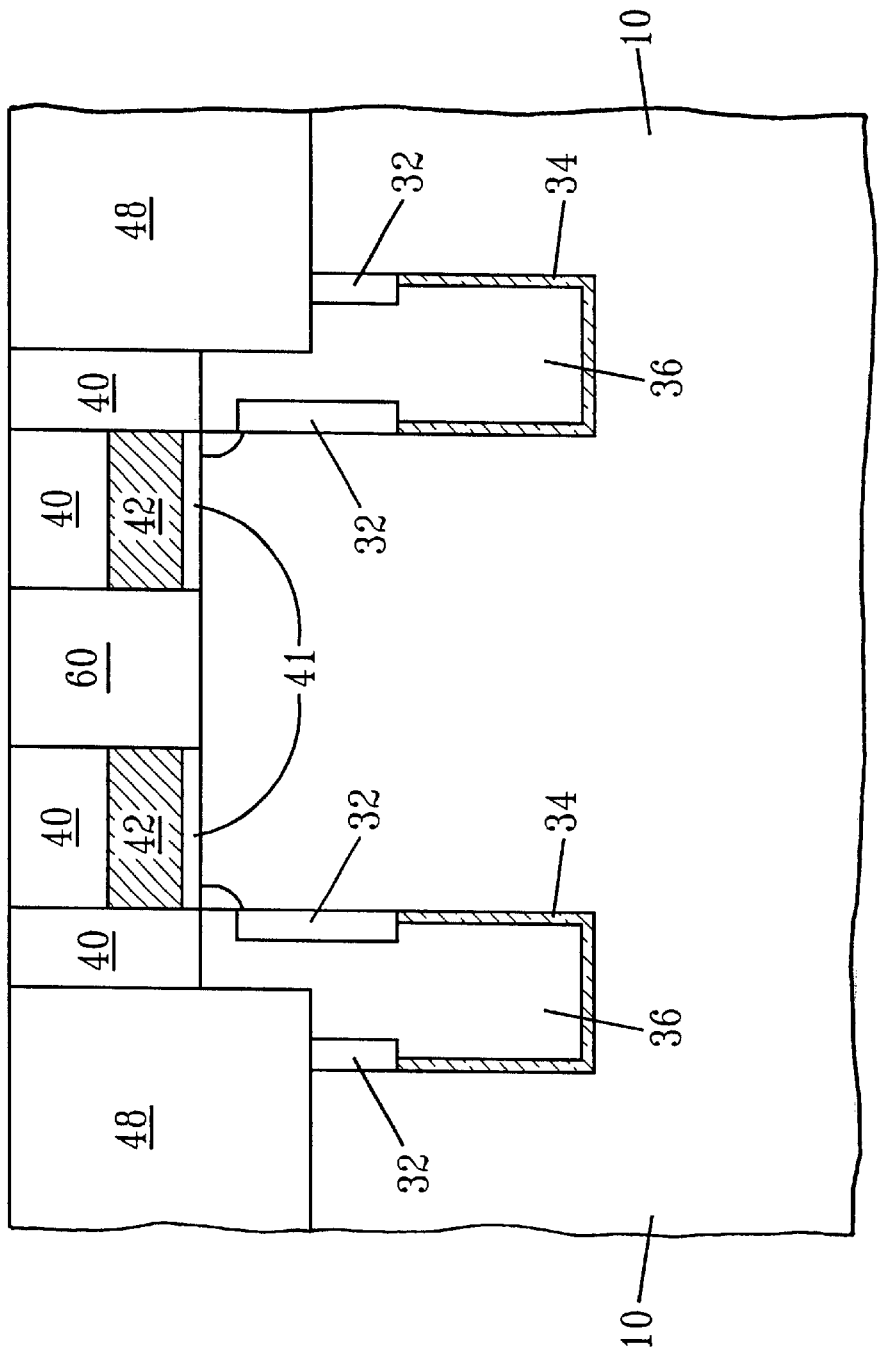
Figure 27:
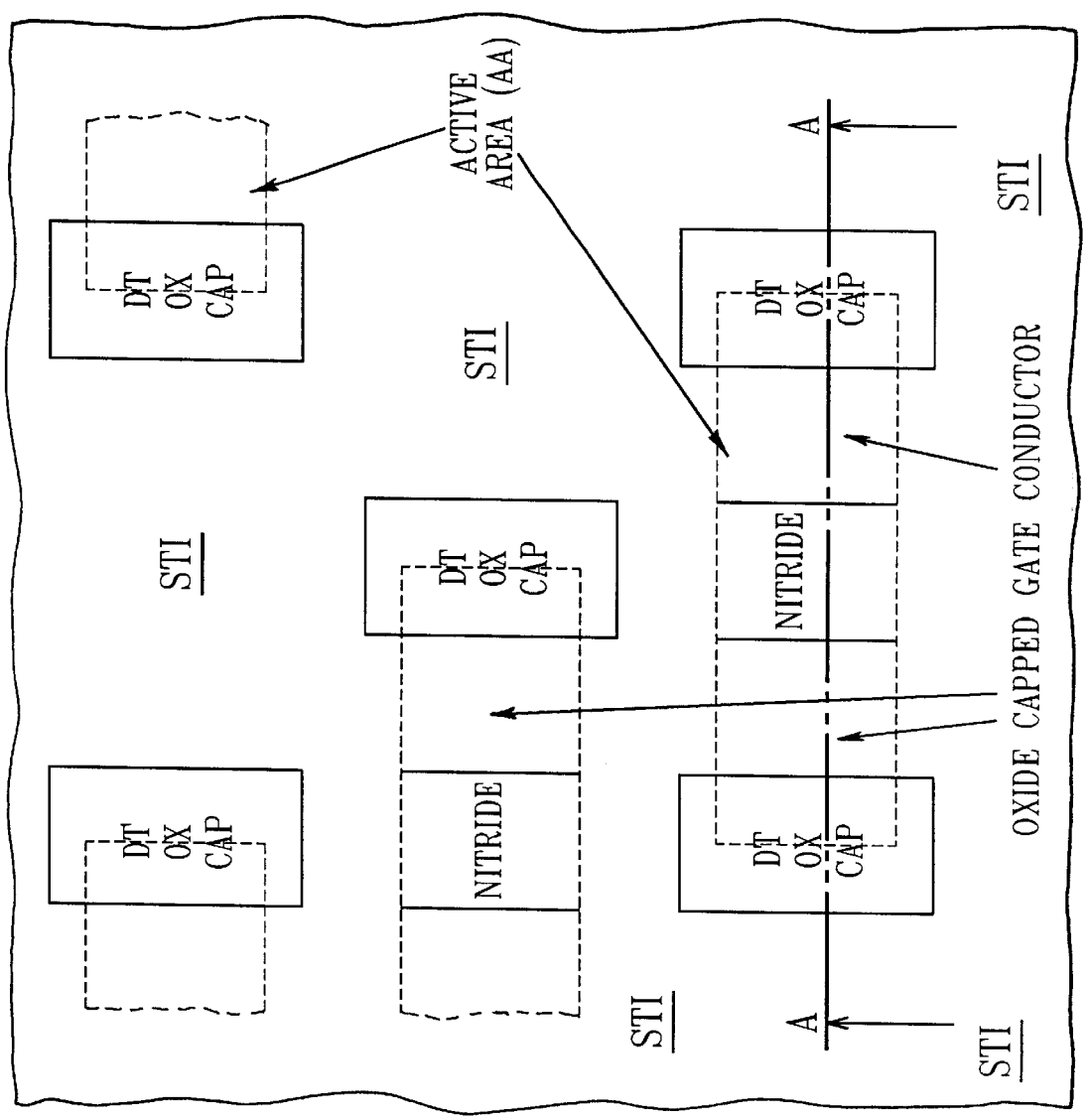
Figure 28A:
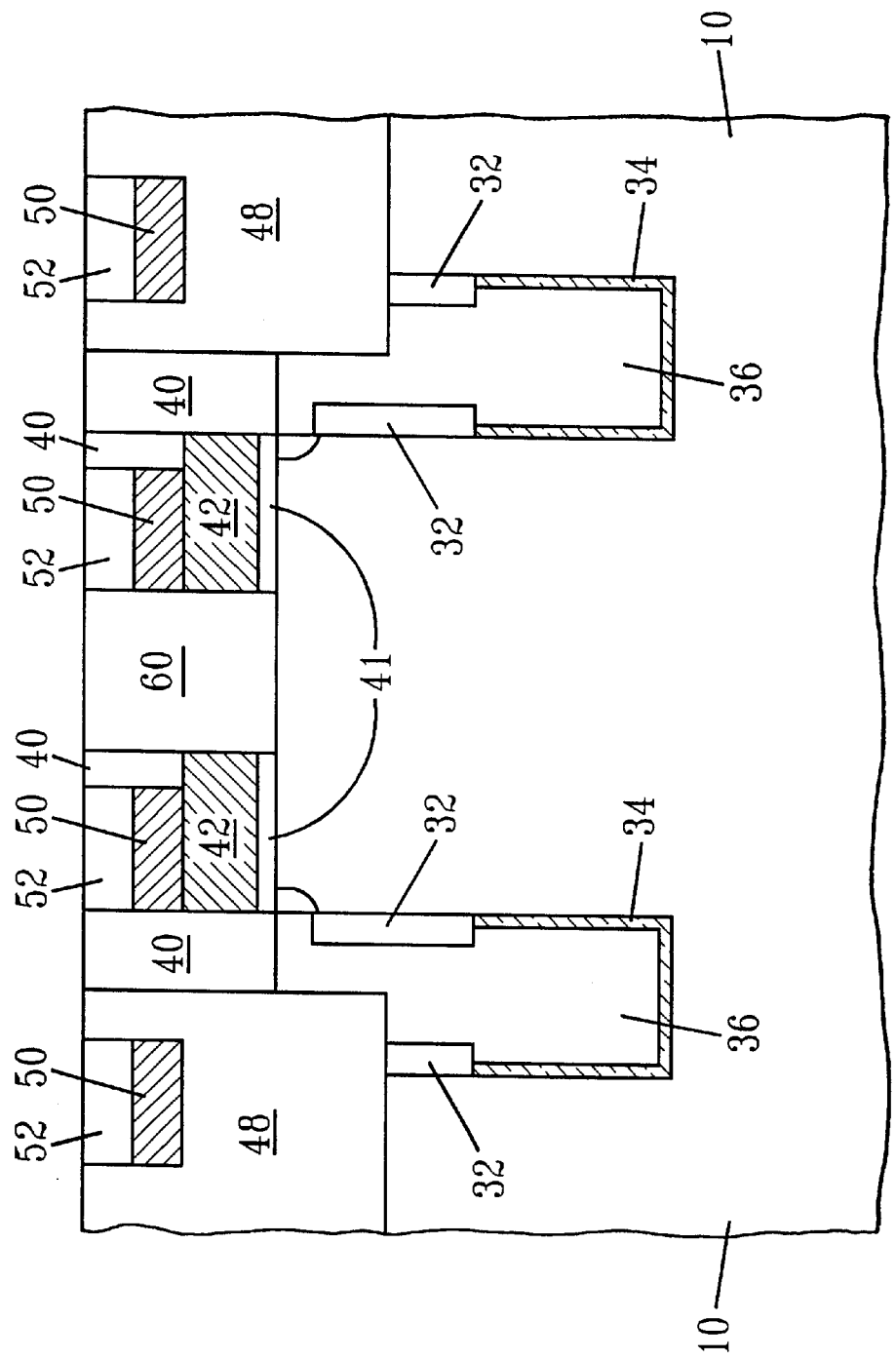
Figure 28B:
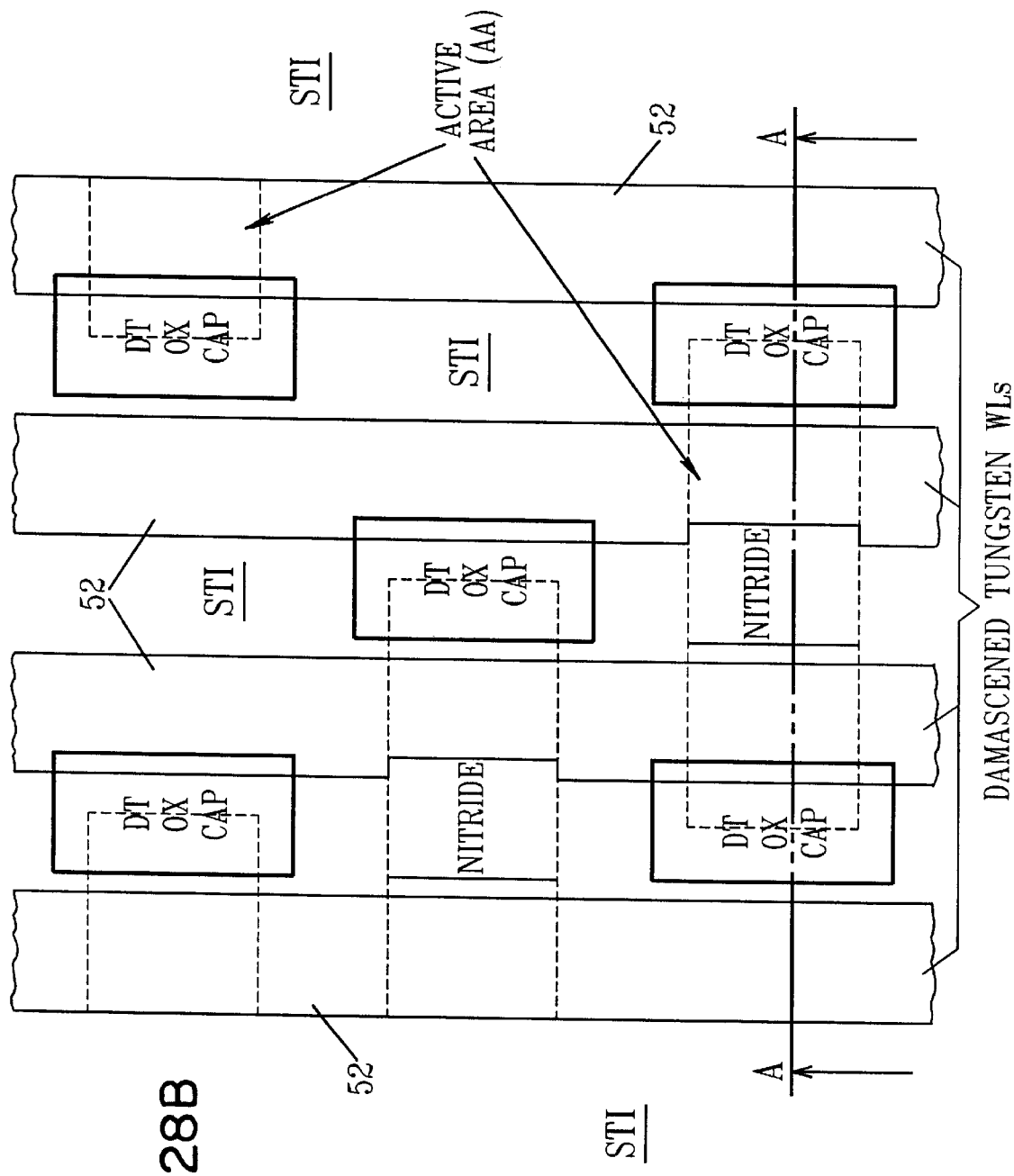

The active area is then patterned in a photoresist 62, See FIG. 25; and the exposed nitride and oxide are reactive ion etched continuing through any uncovered gate conductor polysilicon and into the semiconductor substrate to a depth which is below the bottom of the strap opening. A customary STI sidewall oxidation follows and then the shallow trench is filled with a STI dielectric and planarized forming the STI regions 48 in the structure, See FIGS. 26 and 27.

As in the first embodiment of the present invention, a layer of photoresist is deposited on the planarized structure and a pattern of stripes is formed in the photoresist. Again, these stripes define the wordline pattern. In the support regions, this mask defines openings over the gate conductor polysilicon which will allow the formation of a low resistance conductive layer over the gate conductor polysilicon. It is again noted that the wordline pattern is shown intentionally misaligned to demonstrate the robustness of the wordline process. A structure like the one shown in FIG. 12 above is obtained.

The exposed oxide is then etched selectively to nitride to a depth which is sufficient to expose the top surface of the gate conductor polysilicon. Since the oxide is etched selectively to nitride, the edge of the recess thus formed (and the edge of the wordline conductor) over the active area on the side closest to the bitline does not extend past the edge of the gate conductor polysilicon. This facilitates the subsequent formation of the bitline contact. The recess is then filled with a suitable conductor, e.g., tungsten, and planarized to the top surface of the nitride, See FIGS. 28A (cross-sectional view) and 28B (top view). The top surface of the conductive wordlines 50 (and support gates) is then recessed, selective to oxide and nitride, and capped with a CVD oxide 52. This process defines the wordline gate conductors. As stated above, the distance from the edge of the gate conductor to the edge of the deep trench is independent of overlay since they have been defined by a common mask.

Figure 29:
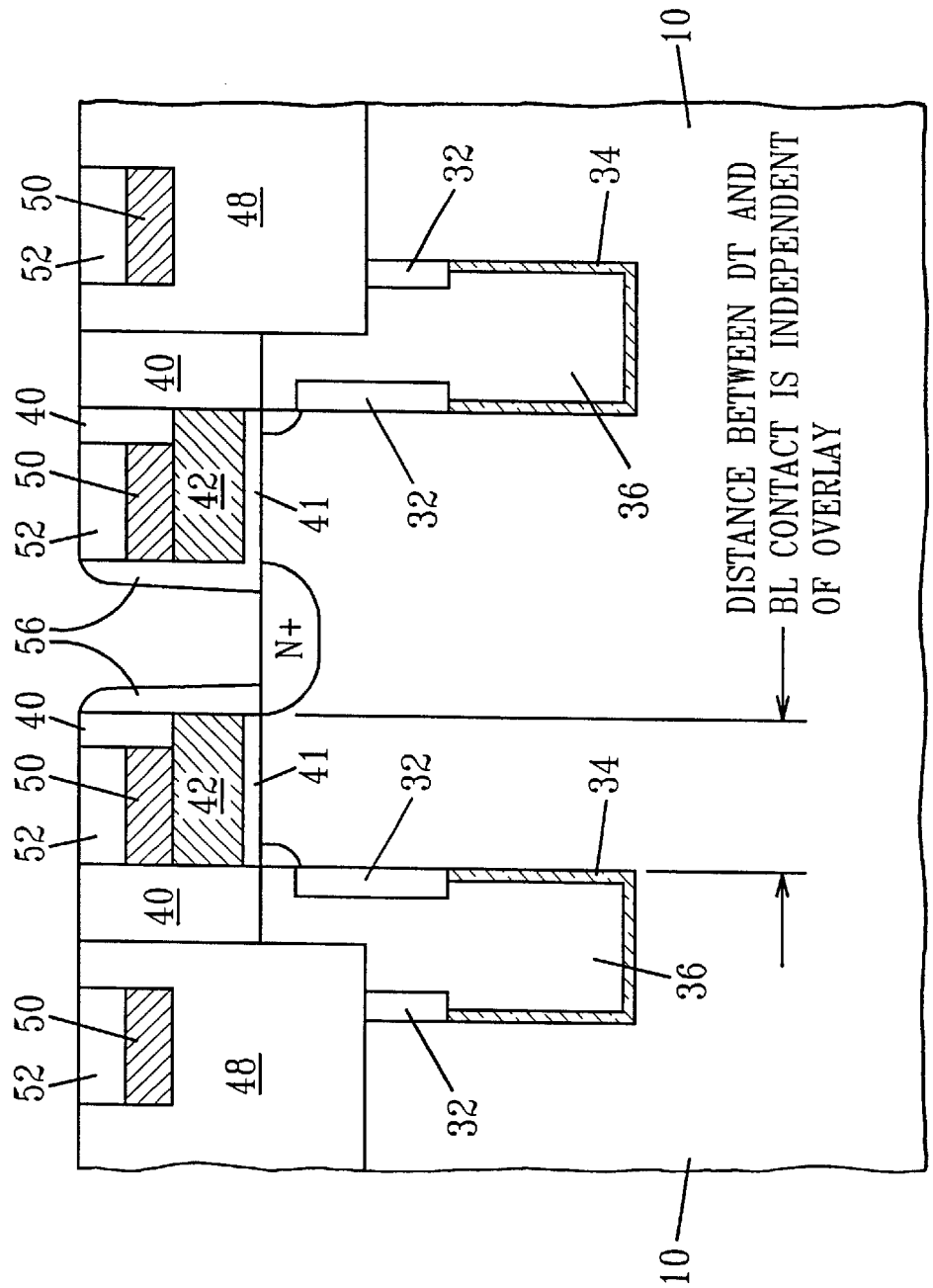

Next, the remaining nitride layer 60 is removed selective to oxide, exposing the surface of the semiconductor substrate. A conventional gate sidewall oxide may now be grown utilizing growing processes well known to those skilled in the art. Source/drain diffusion extensions are formed by either ion implantation or by other means such as gas phase immersion, plasma immersion, implantation doping or solid source doping. Thick oxide spacers are formed on the structure using conventional deposition techniques and more heavily doped source/drain regions are introduced by using one of the above mentioned doping processes. The resultant structure formed from the above processing steps of the present invention is shown in FIG. 29.

Following doping of the source/drain diffusions and formation of the insulating spacers on the sidewalls of the gate and wordline conductors, a layer of boron silicate glass (BSG) may optionally be deposited utilizing conventional deposition techniques well known in the art and thereafter the structure is planarized. This optional step of the present invention is not shown in the accompanying drawings.

Openings are formed in the structure for diffusion contacts utilizing conventional etching techniques well known in the art. These openings may be borderless to the edges of the wordlines since the BSG may be etched selectively to the other oxides which are more dense and have slower etch rates. Alternatively, other types of insulating films which provide enhanced etch selectivity may be substituted for BSG. Contact conductors (i.e. polysilicon, tungsten and the like) may be deposited on the structure and the planarized. Conventional processing as well known to those skilled in the art continues including bitline formation and higher wiring levels formation.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim as new, and desire to secure by the Letters Patent is:

1. A method of forming a memory cell in a semiconductor substrate, said memory cell comprising trench capacitors, transfer transistors, bitlines and wordlines, said method comprising the steps of:

(a) forming a stack of at least four material layers on a surface of a semiconductor substrate, wherein at least two of said material layers of said stack are selectively etchable relative to each other;

(b) patternwise etching through said stack to define a critical pattern of remaining stack and spaces where said semiconductor substrate is exposed, said critical pattern defining possible locations for trench capacitors and gate conductors;

(c) filling said spaces with a filler material which is selectively etchable relative to a topmost layer of said remaining stack;

(d) planarizing the filler material stopping at said topmost layer of said remaining stack;

(e) forming trench capacitors in said semiconductor substrate by etching through portions of said filler material and said substrate, wherein said etching removes a portion of said topmost layer of said remaining stack and exposes a portion of a layer of said stack that is next to the topmost layer;

(f) planarizing the remaining portion of said stack and filler material to remove the remaining portion of the topmost layer of said stack and the remaining portion of the layer that is next to the topmost layer and thereby exposing a layer of said stack that is second from the topmost layer;

(g) replacing at least a portion of either said remaining stack, said remaining filler material or both with a placeholder material corresponding to locations for gate conductors; and (h) forming said gate conductors and remaining portions of said transistors, bitlines and wordlines of said memory cell.

2. The method of claim 1 wherein said stack comprises a pad oxide layer, a nitride pad layer, an oxide layer and a topmost layer, said topmost layer being composed of a nitride or polysilicon.

3. The method of claim 1 wherein step (b) includes lithography and etching.

4. The method of claim 1 wherein said filler material of step (c) is an oxide.

5. The method of claim 1 wherein said placeholder material is tungsten.

6. The method of claim 1 further comprising forming an insulating film on the structure after step (h).

7. The method of claim 6 wherein said insulating film is boron silicate glass.

8. The method of claim 6 further comprising forming contact openings in said insulating film.

9. The method of claim 8 wherein said contacting openings are filled with a conductive material.

10. The method of claim 1 wherein step (e) includes forming a buried plate, forming a collar oxide region in said trench, lining a bottom portion of said trench with a node dielectric and filling said trench with a conductive material.

11. The method of claim 10 wherein a portion of said conductive material is recessed to a depth corresponding to a top surface of said semiconductor substrate.

12. The method of claim 10 wherein a portion of said conductive material is recessed to a depth below a top surface of said semiconductor substrate.

13. The method of claim 1 wherein in step (g) a portion of said filler material is removed by a selective etch process.

14. The method of claim 1 wherein in step (g) a portion of said stack is removed by a selective etch process.

* * * * *

UNITED STATES PATENT AND TRADEMARK OFFICE
CERTIFICATE OF CORRECTION

PATENT NO. : 6,271,080 B1  
DATED : August 7, 2001  
INVENTOR(S) : J. Mandelman et al.

Page 1 of 1

It is certified that error appears in the above-identified patent and that said Letters Patent is hereby corrected as shown below:

Column 1,  
Line 21, "(MOSFETS)" should read -- (MOSFETs) --

Signed and Sealed this

Thirtieth Day of April, 2002

Attest:

Attesting Officer

JAMES E. ROGAN  
Director of the United States Patent and Trademark Office